United States Patent
Kitayoshi

[11] Patent Number: 6,140,960
[45] Date of Patent: Oct. 31, 2000

[54] HOLOGRAM OBSERVATION METHOD FOR THREE-DIMENSIONAL WAVE SOURCE DISTRIBUTION, AND STEREOSCOPIC DIRECTIVITY ESTIMATION METHOD OF ANTENNA AND WAVE DISTRIBUTION OBSERVATION METHOD BASED ON HOLOGRAM OBSERVATION

[75] Inventor: Hitoshi Kitayoshi, Tokyo, Japan

[73] Assignee: Advantest Corporation, Tokyo, Japan

[21] Appl. No.: 09/027,326

[22] Filed: Feb. 20, 1998

[30] Foreign Application Priority Data

| Feb. 20, 1997 | [JP] | Japan | 9-036165 |
| Feb. 20, 1997 | [JP] | Japan | 9-036166 |
| Feb. 24, 1997 | [JP] | Japan | 9-039107 |

[51] Int. Cl.[7] ........................ H01Q 3/00; G01R 13/20; G06K 9/76; G06F 17/00
[52] U.S. Cl. ................ 342/360; 324/76.26; 382/210; 702/67
[58] Field of Search .......................... 324/76.19, 76.33, 324/76.26; 702/66, 67, 75, 76, 77; 342/360; 382/210

[56] References Cited

U.S. PATENT DOCUMENTS

| 5,656,932 | 8/1997 | Kitayoshi | 324/615 |
| 5,689,812 | 11/1997 | Takahashi | 455/67.6 |
| 5,748,314 | 5/1998 | Kitayoshi | 356/346 |
| 5,752,167 | 5/1998 | Kitayoshi | 455/67.1 |

OTHER PUBLICATIONS

Kitayoshi, H. "Holographic Imaging of Electromagnetic Field Vector Flow", Antennas & Propagation Society Int'l Symp, AP–S Digest, vol. 3, 1994, p. 1636–1639.
Kitayoshi et al,"Holographic Imaging of Microwave Propagation", Microwave Symposium Digest, 1993, IEEE MTT–S Int'l, p. 241–244, vol. 1.

*Primary Examiner*—Gregory C. Issing
*Attorney, Agent, or Firm*—Knobbe, Martens, Olson & Bear, LLP

[57] ABSTRACT

A hologram observation method capable of accurately estimating a three-dimensional wave source distribution even when a wave source is close to a hologram observation plane. The hologram observation is performed according to a two-frequency hologram observation method to reconstruct a hologram image. A three-dimensional wave source position is obtained from the reconstructed hologram image, a virtual unit wave source is disposed at the obtained wave source position and an observed wave is synthesized. A hologram image obtained from the synthesized observed wave is reconstructed, and a wave source intensity obtained from the measured hologram image is divided by a wave source intensity at the hologram image obtained from the synthesized observed wave, thereby obtaining a true complex amplitude of the wave source. An area having an intensity more than a predetermined value in the hologram image which is obtained from the synthesized observation wave is excluded from a search range, and each of the foregoing steps is executed.

21 Claims, 14 Drawing Sheets

HOLOGRAM OBSERVATION METHOD FOR THREE-DIMENSIONAL WAVE SOURCE DISTRIBUTION, AND STEREOSCOPIC DIRECTIVITY ESTIMATION METHOD OF ANTENNA AND WAVE DISTRIBUTION OBSERVATION METHOD BASED ON HOLOGRAM OBSERVATION

BACKGROUND OF THE INVENTION

1. Field of the Invention

The present invention relates to a hologram observation method for a radio wave hologram and an acoustic wave hologram, an estimation method for estimating a stereoscopic directivity of an antenna based on the radio wave hologram observation and a wave distribution observation method based on the radio wave hologram observation. The present invention particularly relates to an observation method which can precisely evaluate a reflected wave particularly in a propagation measurement of the radio wave and the acoustic wave and can precisely obtain a three-dimensional wave source distribution, to a method which can estimate a stereoscopic directivity of the antenna under its actual working state in set-up circumstances, to a method for visualizing current distribution and electromagnetic wave radiation on a high frequency circuit board or the like, and to a display method suitable for indicating a vector flow like the current distribution.

2. Description of the Prior Art

Visualization of an electromagnetic wave source by means of a radio wave hologram technology employing interference properties of an electromagnetic wave has been put to practical use, which is used for measuring a high frequency current distribution in a measurement objective and for reducing an unnecessary electromagnetic wave radiation. A hologram can be obtained not only by using the radio wave but also by using a acoustic wave, so that the hologram is made useful for specifying a noise source by visualizing an sound source distribution.

In a wave source image reconstruction by the hologram, a two dimensional interference observation is performed to obtain a two-dimensional interferogram (complex hologram), and the obtained interferogram is reconstructed, thereby displaying the wave source distribution. To be concrete, when an electromagnetic wave source is analyzed, a certain observation frequency is set, two antennas, that is, a fixed antenna and a mobile antenna are used for wave sensors, and a scanning observation plane is set at a position separate from an observation objective. While the mobile antenna is being moved in the scanning observation plane, a signal from the observation objective is received by the two antennas, and at this point of time when the mobile antenna is at each point in the scanning observation plane, a complex correlation value of signals from the two antennas is obtained, whereby the complex interferogram is obtained. The mobile antenna is called also a scanning antenna.

As an active observation, a reference wave is radiated from one antenna and the reference wave is received by the other antenna. Subsequently, the complex correlation value between the original reference wave and the received signal may be obtained.

A method by the radio wave hologram or the acoustic wave hologram can be applicable to a measurement of an electric field intensity distribution in a three-dimensional space as well as to an observation of a wave source distribution on a two-dimensional surface. For example, under conditions where a Fresnel's approximation is established, using Aoki's method (Aoki et al., "Numerical Second Dimension Fresnel's Conversion Method", Electronic, Communication and Information Society Vol. J57-B, No. 8, pp.511–518, August, 1974), the three-dimensional wave source distribution has been obtained in such manner that when a distance between the scanning observation plane and the wave source plane is $z_s$, a size at the scanning observation plane be D×D and a wave source image reconstruction focal distance is $z_b$, $z_b$ is varied under the condition of $z_s \leq D$, thereby obtaining a plurality of reconstructed images, and the three-dimensional wave source distribution is obtained from the plurality of reconstructed images. This method involves many restrictions on actual use, such as operation of varying $z_b$ under the condition of $z_s \leq D$.

Regarding analysis of a wave distribution and a wave source image by a radio wave hologram and an acoustic wave hologram, the inventor of the present invention has proposed a novel measurement method and apparatus for reconstructing a wave source image and a calculating method for reconstruction of a wave source image in, for example, Japanese Patent Laid-Open Application No. 201459/96 (JP, A, 08201459), Japanese Patent Laid-Open Application No. 134113/97 (JP, A, 09134113), Japanese Patent Laid-Open Application No. 133721/97 (JP, A, 09133721), Japanese Patent Application No. 265997/96 and Japanese Patent Application No. 268249/96. Especially, in above JP, A, 08201459 document, the present inventor proved that in the region where Fraunhofer's approximation can be applicable, presence of two reconstruction images observed at different frequencies makes it possible to estimate the three-dimensional wave source distribution without the restriction by the size D of the scanning observation plane and the necessity to vary the $z_b$. In the method disclosed in JP, A, 08201459, in the position where a primary wave source is looked out, a wave source image is reconstructed by acquiring two dimensional interferogram by two frequencies. A propagation delay time from the scanning observation plane to each reconstructed wave source image is considered, thereby rearranging each wave source in a three-dimensional space. Waves from the rearranged wave sources are re-irradiated, thereby synthesizing them. Thus, a three-dimensional wave intensity is estimated. Hereinafter, descriptions for this method will be made. First, a hologram observation model will be described with reference to FIG. 1.

A hologram observation plane 301 is set on an xy-plane (i.e., z=0) including a origin O. It is assumed that a wave source disposed plane 302 exists in a position apart from the hologram observation plane 301 in a z-axis direction by $z_s$. Assuming that a position vector of an observation point on the hologram observation plane 301 and a position vector of a current source on the wave source disposed plane 302 be R and R', respectively, an electric field E(R) produced at a observation point by the current source J(R') is expressed using dyadic Green function $\tilde{G}$ for a three-dimensional space by the equation (1.1).

$$E(R) = -j\omega\mu_0 \int_{-L/2}^{L/2}\int_{-L/2}^{L/2} \tilde{G}(R-R') \cdot J(R') dx_s dy_s \qquad (1.1)$$

Here, assuming that a vector effective length of a receiving antenna be $l_e$, a distance r between the observation point and the current source satisfies an equality r>>λ for a wavelength λ (=c/f: c is a light velocity) corresponding to an observation frequency f, a receiving voltage V at the antenna is expressed by the equation (1.2), $$V = g l_e \cdot E \quad (1.2)$$

where g is constant.

Therefore, a receiving voltage at the observation point is expressed by the equations (1.3) and (1.4) as follows, $$V(R) = -j\omega\mu_0 g \int_{-L/2}^{L/2}\int_{-L/2}^{L/2} l_e(R-R') \cdot \tilde{G}(R-R') \cdot J(R') dx_s dy_s \quad (1.3)$$

$$= \begin{bmatrix} Vh(R) \\ Vv(R) \end{bmatrix} = g \begin{bmatrix} l_e^h \\ l_e^v \end{bmatrix} \cdot E(R) \quad (1.4)$$

where $V_h$ and $V_v$ are antenna receiving voltages for a horizontally polarized wave and a vertically polarized wave, respectively, and $l_e^h$ and $l_e^v$ are vector effective lengths of a antenna for a horizontally polarized wave and a vertically polarized wave, respectively.

If the equation (1.5) is established, $$\tilde{B}(R-R') = -j\omega\mu_0 g \begin{bmatrix} l_e^h(R-R') \\ l_e^v(R-R') \end{bmatrix} \cdot \tilde{G}(R-R') \quad (1.5)$$

$$= \begin{bmatrix} Ahh(\theta h, \phi h)\sin\theta h & Ahv(\theta h, \phi h)\sin\theta v \\ Avh(\theta v, \phi v)\sin\theta h & Avv(\theta v, \phi v)\sin\theta v \end{bmatrix} \frac{e^{-j2\pi r/\lambda}}{r}$$

$$= \tilde{A}(R-R') \frac{e^{-j2\pi r/\lambda}}{r}$$

the equation (1.3) will be expressed by the equation (1.6), $$V(R) = \int_{-L/2}^{L/2}\int_{-L/2}^{L/2} \tilde{B}(R-R') \cdot J(R') dx_s dy_s \quad (1.6)$$

FIG. 2 is a diagram for explaining a mirror image observation model applying the foregoing hologram observation model. It is assumed that in the point 402 in front of (i.e., in a positive direction of the z-axis of) the hologram observation plane 401 (z=0), a primary wave source current $J_0(x_0, y_0, z_0)$ exists. Moreover, it is assumed that a reflection plane 403 is arranged so as to be parallel with the z- and y-axes. It is assumed that an observation electric field at an observation point p on the hologram observation plane 401 is $E_p(x_a, y_a)$, a point 402 is symmetrical to a mirror image point 404 with respect to the reflection plane 403 when viewed from the observation point p, and a mirror image wave source current assumed to be observed at the mirror image point 404 is $J(x_s, y_s, z_s)$. It is also assumed that a distance between the origin O and the point 402 is $r_o$, a distance between the observation point p and the mirror image point 404 is r', and a distance between the origin O and the mirror image point 404 is $\bar{r}'$.

By the approximation expressed by the equation (2.1) using a Fraunhofer's approximation, $$r' \cong z_s - \frac{x_a x_s + y_a y_s}{z_s} + \frac{x_s^2 + y_s^2}{2 z_s} \quad (2.1)$$

the following equations (2.2) and (2.3) are established, $$\begin{bmatrix} J(u,v) = K(x_a, y_s, z_s) \int\int E_p(x_a, y_a) e^{-j(ux_a + vy_a)} dx_a dy_a & (2.2) \\ K(x_s, y_s, z_s) \cong \frac{j4\pi z_s}{\omega\mu_0} e^{jk_0(z_s + (x_s^2 + y_s^2)/2z_s)} & (2.3) \end{bmatrix}$$

where $u = k_0 x_s / z_s$, $v = k_0 y_s / z_s$, $k_0$ is the wave number in a free space, and $\mu_0$ is a magnetic permeability in a vacuum. From the equations (2.1) and (2.3), a propagation delay time will be expressed by the equation (2.4).

$$\frac{dK(x_s, y_s, z_s)_{phase}}{d\omega} \cong (z_s + (x_s^2 + y_s^2)/2z_s)/c \quad (2.4)$$

$$\cong \bar{r}'/c$$

Therefore, the hologram observation give the following equations (2.5) and (2.6).

$$\begin{bmatrix} I(u,v) = \int\int E_p(x_a, y_a) e^{-j(ux_a + vy_a)} dx_a dy_a & (2.5) \\ \frac{dI(u,v)_{phase}}{d\omega} = -\frac{\bar{r}'(u,v)}{c} & (2.6) \end{bmatrix}$$

If the reconstructed image is obtained for two frequencies that are angle frequencies $\omega_1$ and $\omega_2$ ($\omega_1 \neq \omega_2$), and the approximation expressed by the equation (2.7) is carried out, $$\bar{r}'(u,v) \cong r_0 + \quad (2.7)$$

$$\frac{(\theta_1(u,v) - \theta_1(u_0,v_0)) - (\theta_2(u,v) - \theta_2(u_0,v_0))}{\omega_2 - \omega_1} c$$

the following equations (2.8), (2.9) and (2.10) are established, $$\begin{bmatrix} x_s(u,v) = \bar{r}'(u,v) u & (2.8) \\ y_s(u,v) = \bar{r}'(u,v) v & (2.9) \\ z_s(u,v) = \sqrt{(\bar{r}'(u,v))^2 - (x_s(u,v))^2 - (y_s(u,v))^2} & (2.10) \end{bmatrix}$$

and moreover, the following equations (2.11) and (2.12) are established.

$$\begin{bmatrix} I'(u,v) = \frac{4\pi}{\omega_1 \mu_0} \bar{r}'(u,v) |I(u,v)| \cong |J_1(u,v)| & (2.11) \\ \theta'(u,v) = \theta_1(u,v) + \omega_1 \bar{r}'(u,v)/c & (2.12) \end{bmatrix}$$

Therefore, the receiving electric field at any point at the three-dimensional space will be expressed by the equations (2.13) and (2.14).

$$\begin{bmatrix} E(x,y,z;\omega_1) \cong \sum_u \sum_v \frac{A(u,v)}{r''(u,v)} I'(u,v) e^{j(\theta'(u,v) - r''(u,v)\omega_1/c)} & (2.13) \\ r''(u,v) = \sqrt{(x - x_s(u,v))^2 + (y - y_s(u,v))^2 + (z - z_s(u,v))^2} & (2.14) \end{bmatrix}$$

Therefore, by reconstructing the wave source image by the two frequencies, the wave intensity at the three-dimensional space can be estimated, allowing to know a three-dimensional distribution of the wave.

However, in the case of the above-mentioned conventional method recited in JP, A, 08201459 document, an error may not be neglected which is caused by errors in the vector effective length of the receiving antenna and the three-dimensional dyadic Green function. This error becomes larger as the distance between the hologram observation plane and the wave source point becomes shorter. It also becomes larger as angle formed by the wave source point relative to the z-axis when viewed from the observation plane becomes larger. Specifically, since in the conventional method described above, a strict prove compensation is not conducted and Fraunhofer's approximation is employed, there has been a possibility to produce a large error of an estimated amplitude of the wave source close to the observation plane. FIG. 3A is a diagram showing a reconstructed amplitude of the wave source by the conventional method, and FIG. 3B is a diagram showing a reconstructed amplitude in the case where only the directivity of the antenna is compensated. In FIG. 3B, for the directivity of the antenna, a directivity is employed considering the vector effective length. In FIGS. 3A and 3B, a more accurate observation is performed as a level becomes closer to 1.0. As apparent from FIGS. 3A and 3B, according to the above described conventional method, the estimation of the wave source distribution in the three-dimensional space produces an observation error of about 10 dB and leaves an error of about 2 dB in spite of the compensation of the directivity of the antenna.

Further, in case of reconstructing a wave distribution by a radio wave hologram using a fixed antenna and a scanning antenna, the above conventional method is disadvantageous in that scanning of the antenna must be repeated for each observation frequency when visualizations at a plurality of frequency spectra are performed. This is caused by that an apparatus for acquiring an interferogram has a PLL (phase-locked loop) circuit in general and that a phase offset of the PLL circuit is generated when the observation frequency is switched. An absolute phase of a received signal must be measured at each observation frequency when a time response waveform is observed. However, according to the above conventional method, the absolute phase for the fixed antenna side cannot be estimated when the observation frequency is changed.

Next, the present state of the technology for the estimation of the stereoscopic direction of the antenna, which is an applicable field of the hologram observation, will be described.

In recent years, techniques to seize the directivity of the antenna in a working state in an actually set-up place have been required. For example, in a base station antenna used in a cellular mobile communication system, in order to prevent interference between cells at the same frequencies and to modify a cell size in a working state, a variable beam tilt antenna, which is capable of varying a beam tilt, has been used. When such kind of the antenna is used, the directivity of the antenna is sometimes changed after setting up the base station. Such changing of the directivity of the antenna involves a possibility that troubles such as unnecessary side lobes may occur, so that an estimation of the directivity in working state is required.

The evaluation of the directivity of the antenna has heretofore been performed using a radio wave darkroom. Although an evaluation of the directivity in a horizontal plane is easy to perform, an evaluation of a stereoscopic directivity wherein directivities in all directions of an antenna must be observed is difficult for the reason of restriction of the radio wave darkroom. In addition, since an evaluation of the directivity of the antenna in the working state in the actual setting-up circumstance is extremely difficult because of an error due to various kinds of reflection waves and actual impossibility of stereoscopically viewing the observed antenna from all directions. For example, a base station antenna in the mobile communication system is generally set up on a rooftop of a building in a city area. In such circumstances for the setting-up of the antenna, various kinds of reflection waves from adjacent buildings and roads are present so that both are simultaneously received. On the other hand, since an electric field measurement can be conducted only on the ground, it was impossible to seize a stereoscopic directivity of the base station antenna.

Next, the present state of the technology for displaying the result acquired by a hologram observation will be described.

In case of a radio wave observation, a vertical polarization component and a horizontal polarization component can be easily separated to each other. In a conventional method, an wave source image obtained by reconstructing a hologram image for an identical measurement objective is displayed in images in four representation manners by (1) an amplitude distribution of the horizontal polarization component, (2) a phase distribution of the horizontal polarization component, (3) an amplitude distribution of the vertical polarization component, and (4) a phase distribution of the vertical polarization component. However, expert knowledge regarding induction mode and phase difference is necessary for analyzing such image data.

For example, there are several methods for displaying a current distribution and a field distribution as follows: (1) a method for indicating an arrow sign whose length corresponds to the intensity, disclosed in G. Vecchi et al., Proc. 26th European Microwave Conference, Prague, pp. 560–564, September, 1996; (2) a method using a bird's-eye view in which height is set in accordance with the intensity, disclosed in X. Ding et al., Proc. 26th European Microwave Conference, Prague, pp. 574–578, September, 1996; (3) a method using contour lines, disclosed in Y. Gao et al., Proc. 26th European Microwave Conference, Prague, pp. 662–664, September, 1996, and in I. Okada, Technical Report of Electronic, Communication and Information Society, MW93-15, pp. 99–104 (1993–04); and (4) a method using color-coding, disclosed in F. Tilley, IEEE 1995 International EMC Symposium Record, pp. 435–439. These methods are disadvantageous in that amounts and kinds of information displayed in one graph or chart are small.

SUMMARY OF THE INVENTION

The object of the present invention is to provide a hologram observation method capable of precisely estimating a wave source distribution in a three-dimensional space even in the case where a wave source is close to a hologram observation plane.

Another object of the present invention is to provide a method capable of precisely estimating a stereoscopic directivity of an antenna in a working state even in circumstances where natural features in the ground are complicatedly disposed.

Further object of the present invention is to provide an observation method for a wave distribution in which a plurality of frequency spectra can be observed in one scanning of an antenna.

Still further object of the present invention is to provide a display method by which wave distribution data can be analyzed without expert knowledge.

The first object of the present invention can be achieved by a hologram observation method for estimating a three-dimensional wave source distribution by a hologram observation, comprising the steps of: a first step for performing a hologram observation at different frequencies not less than one and for performing a reconstruction of an image for a hologram at each frequency; a second step for selecting a wave source as an area to be extracted among a wave source image in the reconstructed image; a third step for obtaining three-dimensional coordinates of the selected wave source in the area; a fourth step for synthesizing an observed wave assuming that a virtual unit wave source exists in the three-dimensional coordinates obtained in the third step and for reconstructing a hologram image from a synthesizing result; and a fifth step for obtaining a true wave source intensity from a ratio of an intensity in the image reconstructed in the fourth step to an actual intensity of the wave source selected in the second step.

The second object of the present invention can be achieved by a method for estimating a stereoscopic directivity of a measured antenna, comprising steps of: an observation step for using the measured antenna as a primary wave source, disposing an observation point to receive a direct wave and a reflection wave from the primary wave source and obtaining three-dimensional coordinates of the primary wave source and an intensity thereof and three-dimensional coordinates of a mirror image wave source and an intensity thereof by a two-frequency hologram observation, the mirror image wave source corresponding to the reflection wave; an orientation determination step for obtaining an orientation of a reflection point corresponding to the mirror image wave source when viewed from the primary wave source based on the three-dimensional coordinates of the primary wave source and the mirror image wave source which are obtained in the observation step and based on three-dimensional coordinates of the observation point; and a computing step for computing an antenna directivity of the primary wave source toward a direction of the reflection point, by multiplying a reciprocal number of a reflection coefficient at the reflection point with an intensity of a mirror image wave source corresponding to the reflection point The further object of the present invention can be achieved by a method for observing a wave distribution by performing a two-dimensional interference measurement for radiating waves of a plurality of observation frequencies, comprising steps of: providing a first sensor for detecting the radiating wave to output a first signal, a second sensor for detecting the radiating wave to output a second signal, and first and second measurement systems each for extracting a component of a selected observation frequency from the plurality of observation frequencies, each of the first and second measurement systems having a phase-locked loop; a first step for obtaining a correlation between outputs of the first and second measurement systems to output a first correlation value by inputting the first signal to the first and second measurement systems; a second step for obtaining a correlation between outputs of the first and second measurement systems to output a second correlation value by inputting the first signal to the first measurement system while inputting the second signal to the second measurement system; selecting different observation frequencies and performing the first step and the second step for each of the selected different observation frequencies to obtain the first and second correlation values; and canceling, by using the first correlation value, an affection of a phase offset value of the phase-locked loop due to a change in an observation frequency, the affection being included in the second correlation value.

The still further object of the present invention can be achieved by a wave distribution displaying method based on an amplitudes $G_1''$ and a phase $\theta_1''$ for a first polarization component and an amplitude $G_2''$ and a phase $\theta_2''$ for a second polarization component at each point, comprising steps of: generating an ellipse based on the amplitudes $G_1''$ and $G_2''$ and the phases $\theta_1''$ and $\theta_2''$ at each point; and displaying the ellipse on a display screen at a display point corresponding to the point.

In the present invention, the observed wave means an electric field observed in the hologram observation plane if, for example, an observation for a radio wave hologram is being performed, and the observed wave means also a sound field observed if an observation for a sound wave hologram is being performed. Moreover, the virtual unit wave source means a virtual wave source having an intensity of a predetermined value, and the virtual unit wave source means a virtual unit current source if an observation for a radio wave hologram is being performed. From viewpoint of simplifying the computation, the foregoing predetermined value should be preferably one (1).

In the hologram observation method of the present invention, assuming that the virtual unit wave source exists in the three-dimensional wave source position obtained by the hologram observation, the observed wave is synthesized to obtain the hologram image, and the wave source intensity measured by the intensity of the hologram image by the virtual unit wave source is normalized, whereby a true wave source amplitude is obtained. Moreover, areas are excluded where the intensity is larger than a predetermined value in the reconstructed image obtained from the virtual unit wave source, and computation is repeatedly performed, whereby extraction of pseudo wave sources due to spreading of the image can be prevented and the wave source amplitude and the wave source distribution can be more precisely obtained.

In the hologram observation method of the present invention, in the image reconstructed in the fourth step, regions of the intensities not less than a predetermined value should be excluded from the area selected in the second step and the third, fourth and fifth steps should be repeated. Moreover, the synthesis of the observed wave in the fourth step should be performed considering the directivity of the antenna used for the hologram observation and the spread in the reconstructed image.

In the stereoscopic directivity estimation method of an antenna of the present invention, the direct wave and the reflection wave from the primary wave source are received and the two frequency hologram observation is conducted. From the obtained wave source intensity and orientation of the reflection point, the stereoscopic directivity of the primary wave source is estimated. Even in the case where places where the observation point can be positioned are limited, by utilizing the reflection wave positively the estimation of the stereoscopic directivity over the wide range can be performed. As a method of the two frequency hologram observation, the foregoing hologram observation method should be used.

Except the case of a TE (transverse electric wave) incidence into concrete, a reflection coefficient at the reflection point depends on an incidence angle. In the stereoscopic directivity estimation method of the present invention, when the reflection coefficient at the reflection point depends on the incidence angle, also the incidence angle at the reflection point when viewed from the primary wave source in the orientation determination step should be computed. In the computation step, after the reflection coefficient is computed based on the incidence angle, the antenna directivity should be preferably computed.

Moreover, in the stereoscopic directivity estimation method of the present invention, a plurality of mirror image wave sources are observed in one observation point, and the orientation determination step and the computation step are preferably executed for every mirror image wave source. Moreover, in order to obtain the directivity at many directions, it is preferable to execute the observation step, the orientation determination step and the computation step while the observation point is being moved.

The above and other objects, features, and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 4:
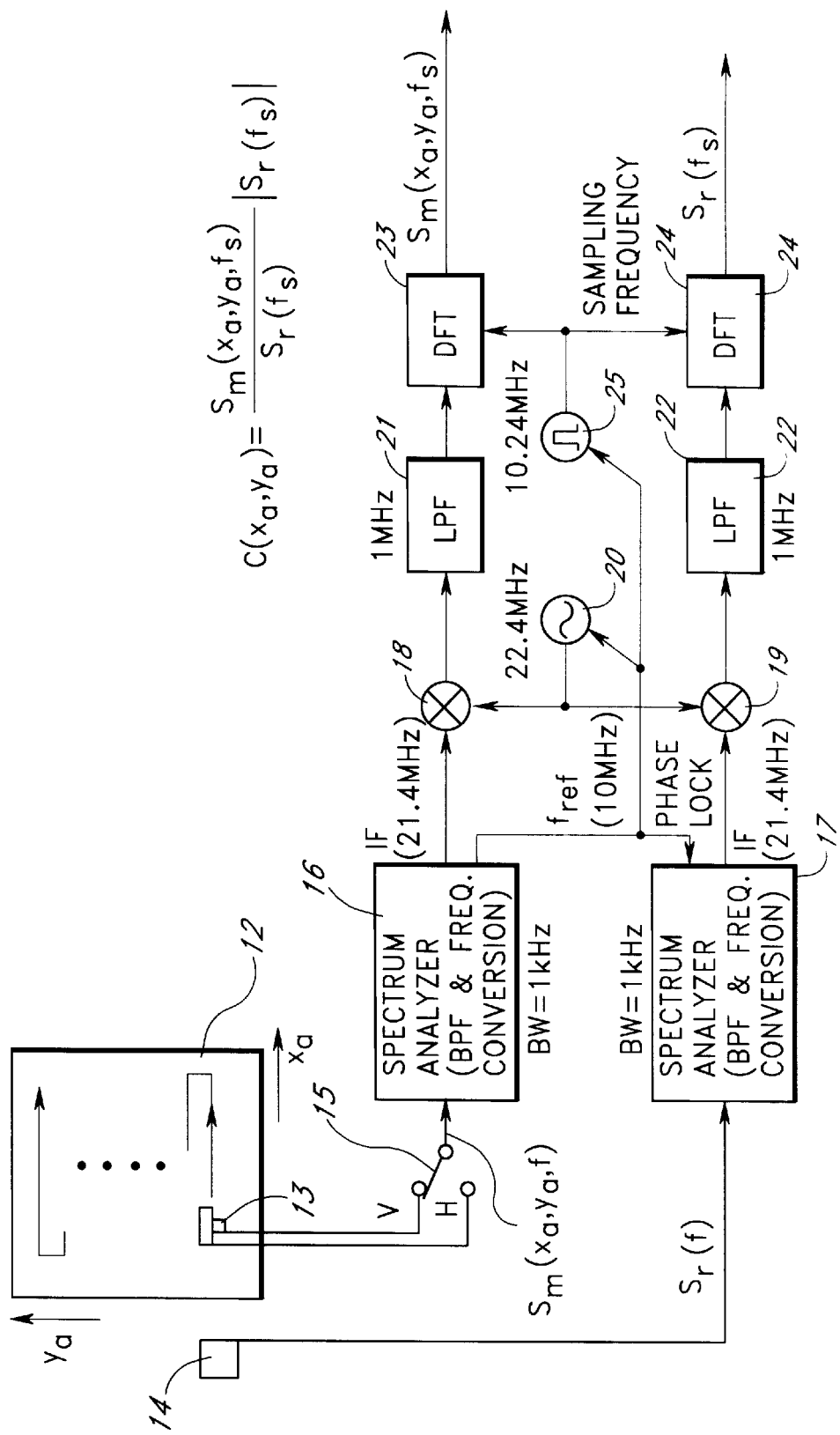
FIG. 4 is a block diagram showing an example of a constitution of an observation apparatus used in performing a hologram observation method of a preferred embodiment of the present invention.

A hologram observation apparatus shown in FIG. 4 performs an observation based on a hologram observation method of a preferred embodiment of the present invention. Here, a case where a three-dimensional wave source distribution is obtained by performing an observation of a radio wave hologram will be described.

The hologram observation apparatus observes the radio wave hologram at a non-modulated wave, which comprises a hologram observation plane 12 disposed on an xy-plane (i.e., z=0). A size of the hologram observation plane 12 is, for example, 58 cm square, and a scanning antenna 13 for observing both of a vertical polarization component (V) and a horizontal polarization component (H) is moved on the hologram observation plane 12, for example, at intervals of 9 mm by a scanning mechanism (not shown). Apart from the scanning antenna 13 on the hologram observation plane 12, a fixed antenna 14 which does not move is disposed. A position of the scanning antenna 13 on the hologram observation plane 12 shall be expressed with a symbol ($x_a$, $y_a$).

Receiving signals of the vertical polarization component and the horizontal polarization component from the scanning antenna 13 are inputted to an alternation switch 15, and one of the vertical and horizontal polarization components is selected, thereby inputting the selected one to a spectrum analyzer 16. On the other hand, the receiving signal from the fixed antenna 14 is inputted to another spectrum analyzer 17. These spectrum analyzers 16 and 17 pass the receiving signals having desired frequency band components (for example, frequency bandwidth BW=1 kHz) from the receiving signals from the scanning and fixed antennas 13 and 14 and perform frequency conversions for the selected signals to convert signal of an intermediate frequency (IF), for example (21.4 MHz). Using a spectrum analyzer R3271 made by Advantest Cooperation, for example, a phase-lock to a reference frequency signal $f_{ref}$ is performed, thereby performing an operation at a zero span mode. Thus, such spectrum analyzers 16 and 17 can be realized. When the spectrum analyzer R3271 made by Advantest Cooperation, is used as the spectrum analyzer, since a reference frequency source of 10 MHz is actually built therein, a signal from the reference frequency source built in one spectrum analyzer 16 is used as the foregoing reference frequency signal $f_{ref}$, and this reference frequency signal $f_{ref}$ may be supplied to the other spectrum analyzer 17.

Mixers 18 and 19 are provided on both outputs of the spectrum analyzers 16 and 17. A local oscillation frequency of 22.4 MHz is supplied from a local oscillator 20 to the mixers 18 and 19. The signal of the intermediate frequency IF is subjected to a frequency conversion so as to get a signal of, for example, about 1 MHz. The local oscillator 20 operates while it is being phase-locked to the reference frequency signal $f_{ref}$. Low pass filters (LPF) 21 and 22 to remove a unnecessary high frequency component from the outputs of the mixers 18 and 19 are provided on the output sides of the mixers 18 and 19, respectively. Outputs from the low pass filters 21 and 22 are inputted to Fourier transform sections 23 and 24, respectively. The Fourier transform sections 23 and 24 perform a complex discrete Fourier transformation for the outputs of the low pass filters 21 and 22, and clock signals of, for example, a frequency of 10.24 MHz from a clock oscillator 25 are supplied thereto as sampling clocks. The clock oscillator 25 also operates while it is being subjected to a phase lock at the reference frequency signal $f_{ref}$. A synthesize Fourier integration (SFI) of two channels is executed by these two Fourier transform sections 23 and 24.

When an output from one Fourier transform section 23 corresponding to the scanning antenna 13 shall be $S_m(x_a, y_a, f_s)$ ($f_s$: a frequency) and an output from the other Fourier transform section 24 corresponding to the fixed antenna 14 shall be $S_r(f_s)$, a complex hologram $C(x_a, y_a)$ is expressed by the following equation (3).

$$C(x_a, y_a) = \frac{S_m(x_a, y_a, f_s)}{S_r(f_s)} |S_r(f_s)| \qquad (3)$$

Figure 5:
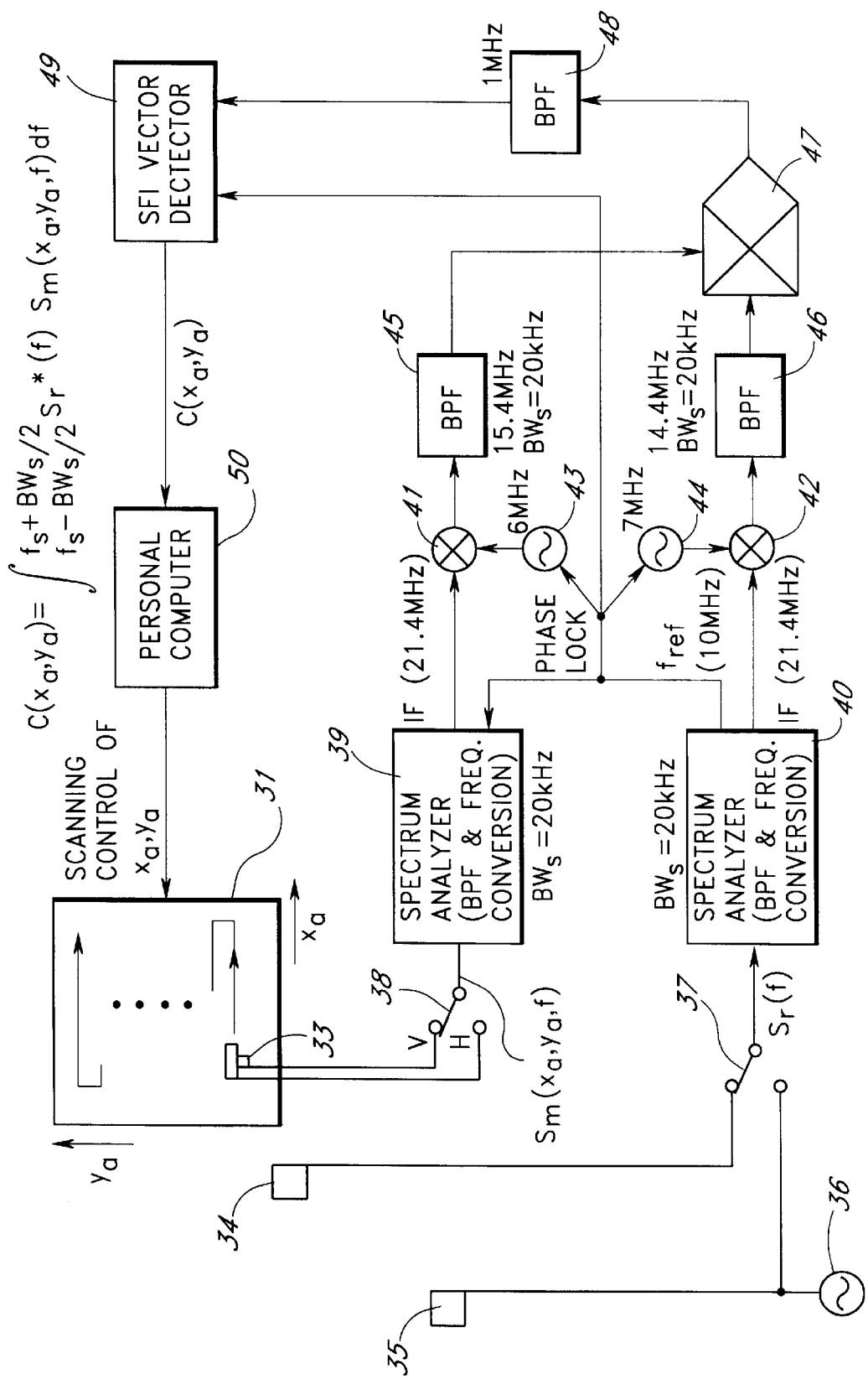
FIG. 5 is a block diagram showing an example of another constitution of the observing apparatus.

Moreover, when a modulated wave is used, the hologram observation apparatus shown in FIG. 5 can be used. The hologram apparatus shown in FIG. 5 comprises a hologram observation plane 31 disposed in an xy-plane. A size of the hologram observation plane 31 is, for example, 58 cm square. A scanning antenna 33 for observing vertical polarization component (V) and horizontal polarization component (H) is moved on the hologram observation plane 31 at intervals of 9 mm by a scanning mechanism (not shown). Moreover, a fixed antenna 34 and a radiation antenna 35 are provided, apart from the scanning antenna 33. The radiation antenna 35 is connected to a signal source 36. The fixed antenna 34, the radiation antenna 35 and the signal source 36 serve to get a reference wave for the hologram observation. By means of an alternation switch 37, one of the receiving signal from the fixed antenna 34 and the signal from the signal source 36 is obtained as the signal of the reference wave.

The receiving signals of the vertical and horizontal polarization components from the scanning antenna 33 are inputted to the alternation switch 38. One of the vertical and horizontal components is selected, and the selected one is inputted to a spectrum analyzer 39. Furthermore, the reference signal obtained by selecting one of the signal from the fixed antenna 34 and the signal from the signal source 36 by the alternation switch 37 is inputted to the other spectrum analyzer 40. The spectrum analyzers 39 and 40 selectively serve to allow the desired frequency band components (for example, bandwidth $BW_s=20$ kHz) of both of the receiving signal from the scanning antenna 33 and the reference signal to pass therethrough, respectively. At the same time, the spectrum analyzers 39 and 40 serve to perform a frequency conversion to convert them to an intermediate frequency IF (for example, 21.4 MHz). For example, this frequency conversion can be performed by phase-locking both of the spectrum analyzers 39 and 40 to the reference frequency signal $f_{ref}$ and by operating them at a zero span mode. For example, spectrum analyzer R3271 made by Advantest Cooperation can be used for each of the spectrum analyzers 39 and 40. In this embodiment, a reference frequency source of, for example, assuming that 10 MHz be built in the spectrum analyzer 40, a signal from the reference frequency source built in the spectrum analyzer 40 shall be used as the foregoing reference frequency signal $f_{ref}$, and the reference frequency signal $f_{ref}$ is supplied to the other spectrum analyzer 39.

Mixers 41 and 42 are provided on output sides of the spectrum analyzers 39 and 40, respectively. The mixers 41 and 42 are supplied with local oscillation frequencies of, for example, 6 MHz and 7 MHz from local oscillators 43 and 44, respectively. The mixers 41 and 42 perform the frequency conversion for the signals of the intermediate frequency IF from the spectrum analyzers 39 and 40, thereby converting them to the signals of, for example, 15.4 and 14.4 MHz, which is different from each other by about 1 MHz. The local oscillators 43 and 44 operate by being phase-locked to the reference frequency $f_{ref}$. In order to fetch out only signals of a predetermined frequency component from the outputs of the mixers 41 and 44, band pass filters (BPF) 45 and 46 of, for example, a bandwidth $BW_s$ of about 20 kHz are provided on the output sides of the mixers 41 and 42. A multiplier 47 for receiving the outputs from the band pass filters 45 and 46 is provided. An output from the multiplier 47 passes through a band pass filter 48 (for example, a center frequency: $f_0=1$ MHz, a bandwidth: $BW_c=1$ kHz). Then, the output from the multiplier 47 is inputted to a synthesized Fourier integration (SFI) vector detector 49 together with the reference frequency $f_{ref}$. The SFI vector detector 49 performs a synthesized Fourier integration to perform a vector detection for the input signal (i.e., output from the multiplier 47), and outputs the complex hologram $C(x_a, y_a)$ expressed by the following equation (4).

$$C(x_a, y_a) = \int_{f_s-BW_s/2}^{f_s+BW_s/2} S_r^*(f) S_m(x_a, y_a, f) df \qquad (4)$$

Here, in the equation (4), $S_m(x_a, y_a, f)$ denotes a receiving signal of the scanning antenna 33, and $S_r(f)$ denotes the reference wave signal. Actually, a multiplication in the integration formula of the equation (4) is performed by the multiplier 47. The vector detection is performed by the SFI detector 49, whereby real and imaginary components of the complex hologram are obtained as cosine and sine components which are extracted in the SFI vector detector 49, respectively.

The complex hologram computed as described above is inputted to a personnel computer 50 to be stored therein. The personnel computer 50 also controls the position $(x_a, y_a)$ of the scanning antenna 33 on the hologram observation plane 31.

Figure 6:
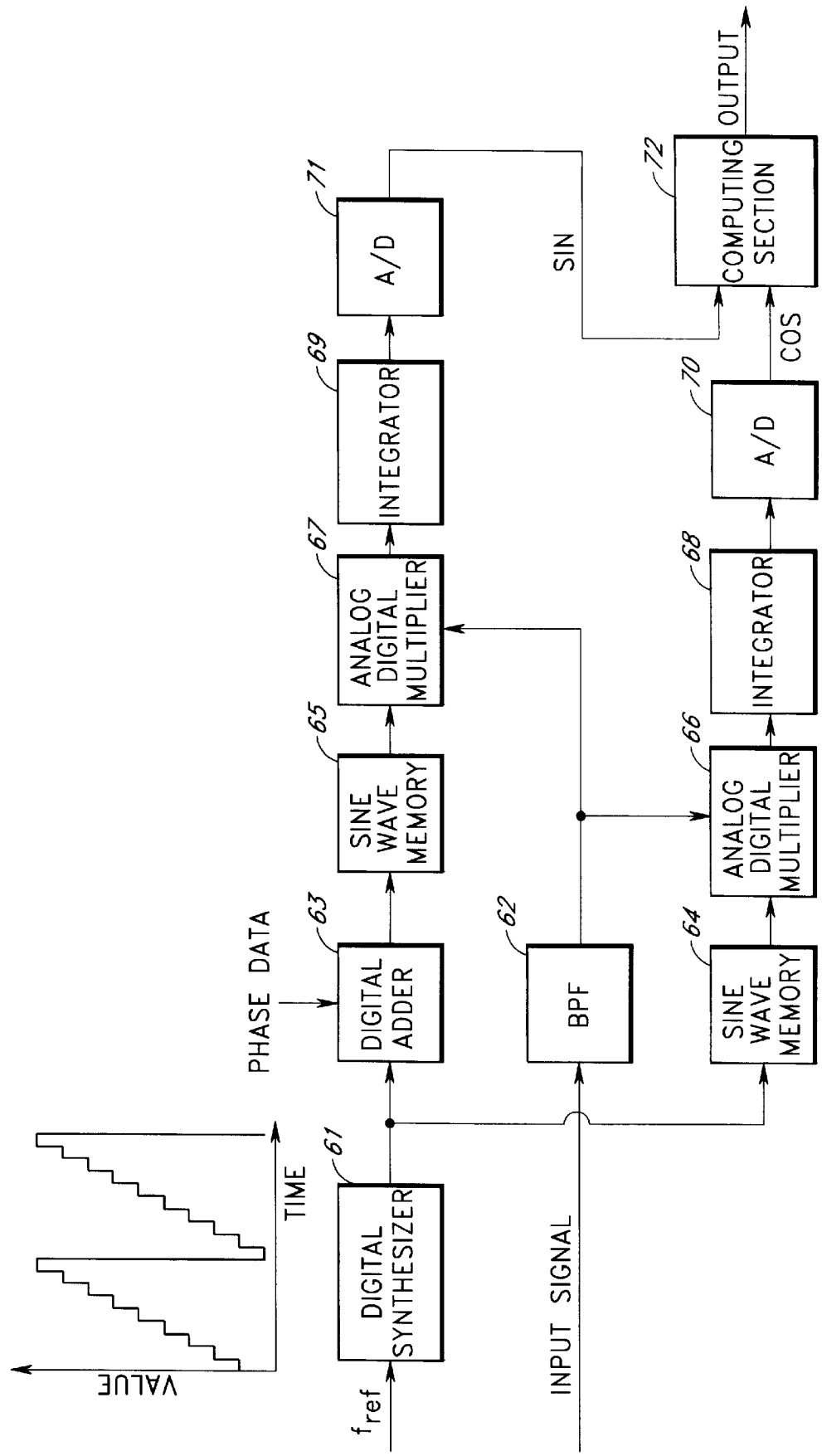
FIG. 6 is a block diagram showing an example of a constitution of a synthesized Fourier integration (SFI) vector detector.

A constitutional example of the SFI vector detector 49 is shown in FIG. 6.

In the SFI vector detector 49, a digital synthesizer 61 for receiving the reference frequency signal $f_{ref}$ is provided. As shown in the figure, the digital synthesizer 61 generates a digital signal changing the value in steps according to the reference frequency signal $f_{ref}$. The digital signal is directly inputted to one sine wave memory 64 while the digital signal is inputted to the other sine wave memory 65 after passing through a digital adder 63. In the digital adder 63, phase data equal to the amount of phase advance is added. The sine wave memories 64 and 65 stores the values of the sine wave at each time when one cycle is divided into equal parts. By applying digital signals to the memories 64 and 65, which change their values by a predetermined increment in synchronization with clocks, the memories 64 and 65 output the digital signals changing their value in response to the sine wave. On the output sides of the sine wave memories 64 and 65, provided are analog digital multipliers 66 and 67 each of which multiplies the digital and analog signals. Outputs of the sine wave memories 64 and 65 are inputted to analog digital multipliers 66 and 67 as a digital signal.

The input signal which is inputted to the SFI vector detector 49 from the multiplier 47 (see FIG. 5) via the band pass filter 48 is supplied to an input terminal of the analog side of the analog digital multipliers 66 and 67 via the band pass filter 62. Outputs from the analog digital multipliers 66 and 67 are inputted to analog-to-digital converter (A/D converter) 70 and 71 via integrators 68 and 69, respectively. Then, the outputs from the analog digital converters 70 and 71 are inputted to a computing section 72, and a vector detection result is computed therein.

By using the digital synthesizer 61 and the sine wave memories 64 and 65, sine waves of any frequency, the phase of which is locked to the reference frequency $f_{ref}$, are generated as the reference signal at the SFI vector detector 49. Then, the analog digital multipliers 66 and 67 multiply the reference signals of, for example, 1 MHz synthesized from the reference frequency signal $f_{ref}$ with the input signals, respectively, and the multiplication results are integrated by the integrators 68 and 69, respectively. Therefore, by setting phase data to a value equal to the quantity of phase shifting $\pi/2$, the phase data being added in the digital adder 63, as to components of a frequency of 1 MHz of the input signals, a sine component and a cosine component are extracted, whereby a vector detection is performed.

Figure 7:
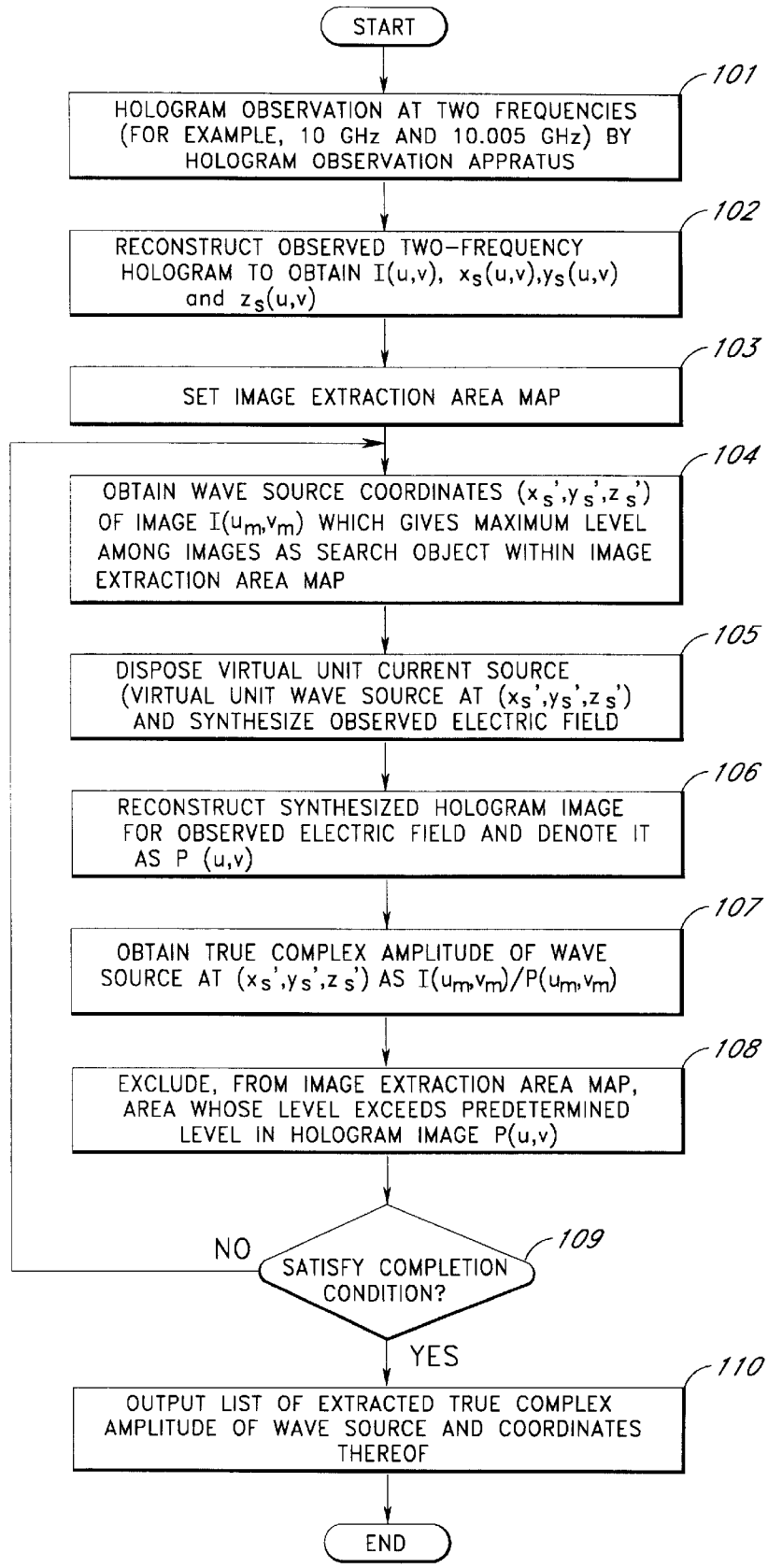
FIG. 7 is a flow chart showing procedures of the hologram observation method.

Procedures when the observation method of the present invention is performed using the foregoing hologram observation apparatus will be described. FIG. 7 is a flow chart showing processing steps.

First, in the step 101, a hologram at two frequencies, for example, 10 GHz and 10.005 GHz, is observed. Using the foregoing equations (2.5) to (2.10), in the step 102, I(u, v), $x_s(u, v)$, $y_s(u, v)$ and $z_s(u, v)$ are computed from a reconstructed image of the observed two-frequency hologram. Then, in the step 103, for the portion where it is intended to extract the wave source therefrom in an image space of (u, v), setting of a marking showing that the portion is a search object, namely, an image extraction area map, is performed.

Next, in the step 104, the image $I(u_m, v_m)$ giving the maximum level among the image dealt as the search objects by the image extraction area map is obtained. The wave source coordinates $(x_s', y_s', z_s')$ in this image is obtained. Specifically, $$x_s' = x_s(u_m, v_m) \quad (5.1)$$

$$y_s' = y_s(u_m, v_m) \quad (5.2)$$

$$z_s' = z_s(u_m, v_m) \quad (5.3)$$

shall be established. Then, in the step 105, a virtual unit current source is disposed as the virtual unit wave source on this coordinates $(x_s', y_s', z_s')$. Using the foregoing equations (1.1) to (1.6), the observed electric field is synthesized. By using the equations (1.1) to (1.6), it is said that the spread of the reconstructed image and influences of the directivity of the receiving antenna were considered. Next, in the step 106, the hologram image for the observed electric field which was synthesized in the step 105 is reconstructed according to the equation (2.5), and this reconstructed image is denoted as P(u, v).

Subsequently, in the step 107, by comparing a reconstructed intensity of the virtual unit wave source, which is disposed in the same position as the true wave source, with the observed reconstructed image, the true wave source intensity is obtained. Specifically, the true complex amplitude of the wave source at $(x_s', y_s', z_s')$ is obtained as $I(u_m, v_m)/P(u_m, v_m)$. When the true wave source intensity is obtained, in the step 108, an area, where the value of P(u, v) in the hologram after the synthesis exceeds a predetermined level (i.e., image extraction limit), is searched and the searched area is excluded from the image extraction area map. The exclusion of that area is done to prevent an extraction of the virtual wave source because of the spread of the image. In the step 108, the region is excluded, which corresponds to the wave source the true complex amplitude of which is obtained by performing the processes to the step 107. Thus, when the next wave source is searched, influences of the spread of the image of the wave source which has been already obtained are prevented.

Thereafter, in the step 109, it is judged whether completion conditions are satisfied. If the completion conditions are not satisfied, the process returns to the step 104, and the foregoing processes are repeated. If the completion conditions are satisfied, the process advances to the step 110, and the complex amplitude of the extracted true wave source and the list of the coordinates thereof are outputted, thereby completing the processes. Appropriate completion conditions in the step 109 may be arbitrarily adopted. The following conditions may be adopted, for example: "Wave sources more than a previously set number were extracted.", "A size of the image extraction area is reduced at more than a predetermined ratio compared to a whole." and "The extraction object level $I(u_m, v_m)$ became less than a predetermined value (for example, the foregoing image extraction limit)."

Figure 8A:
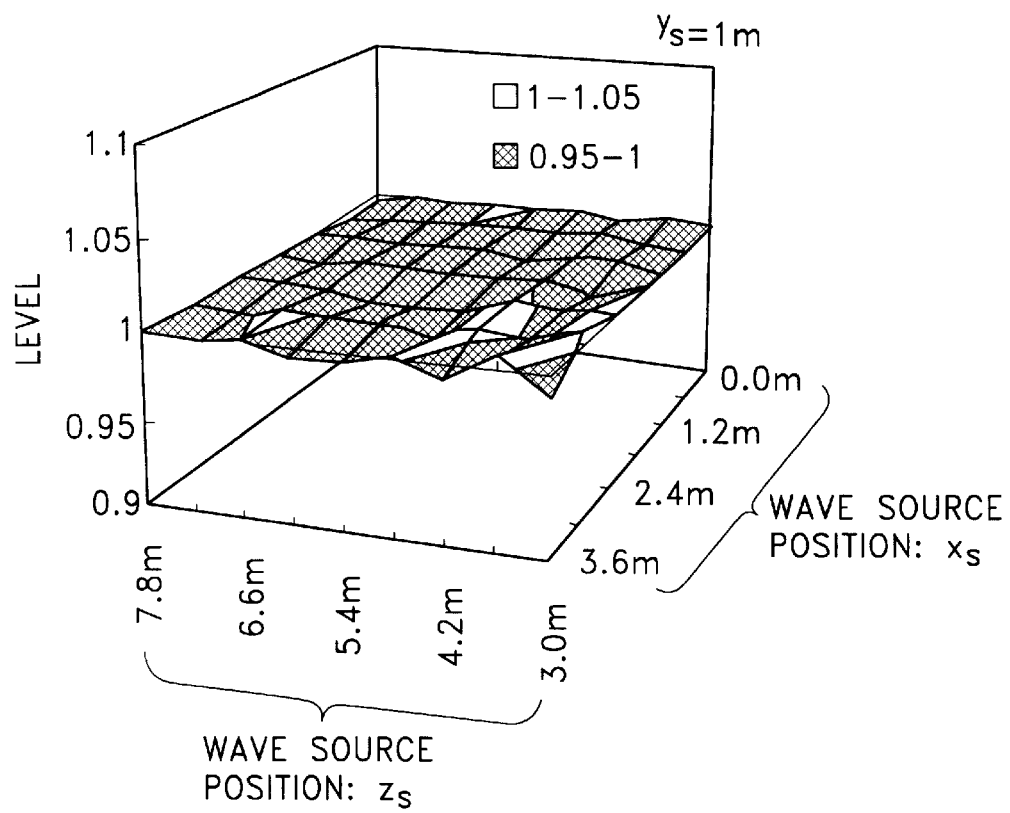
FIG. 8A is a graph showing results obtained by simulating an error of a wave source amplitude measurement according to the method of the present invention.

FIG. 8A shows the results of simulating a error of a wave source amplitude measurement in the case where the method of this embodiment of the present invention is used. In FIG. 8A, shown is the error of the wave source amplitude measurement when the size of the hologram observation plane 12 was set to 57 cm square, the observation frequency $f_s$ was set to 10 GHz, and the two frequency holography observation under the condition of $y_s=1$ m was conducted. Compared to the conventional reconstructed amplitude shown in FIG. 3A and FIG. 3B, according to the present embodiment, it is proved that the error is significantly reduced.

Figure 8B:
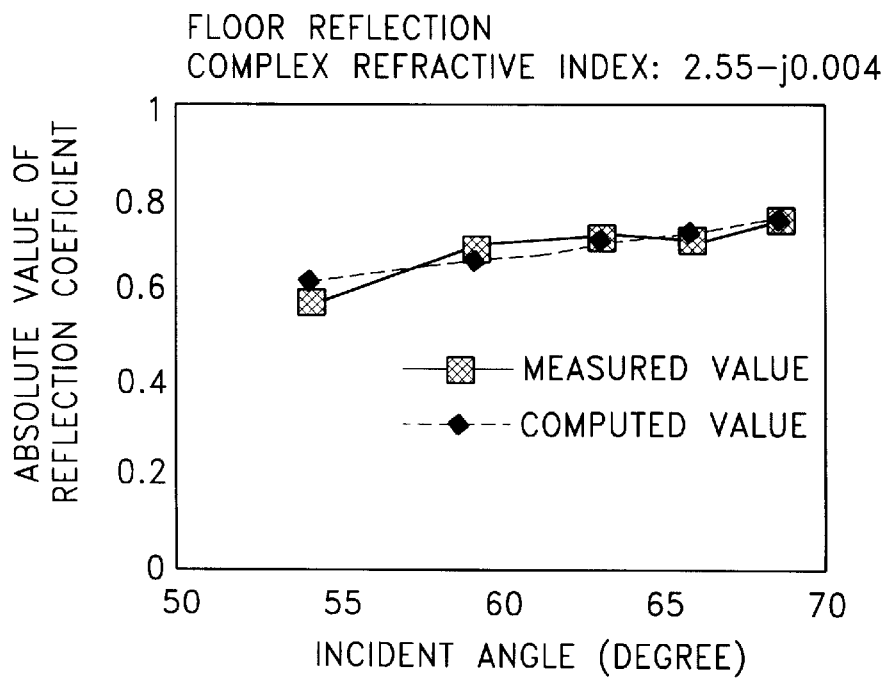
FIG. 8B is a graph showing results of actual observation of floor reflection coefficients.

FIG. 8B shows the actual measurement results of a floor reflection coefficient according to the two frequency hologram method of the present embodiment. Here, the incidence onto the floor should be performed in a TE mode and the complex refractive index of the floor reflection should be 2.55–j0.004. Under the conditions that the size of the hologram observation plane was set to 57 cm square, the observation frequency was set to 10 GHz, the dipole antenna serving as the wave source is disposed at the position above the floor by 1 m, and $x_s=0.4$ m, $z_s=3.0$ to 5.4 m, the ratio of the mirror image wave source intensity to the primary wave source intensity was observed. According to the method of this embodiment of the present invention, it is proved that there is almost no difference between the computed value and the measurement value.

Figure 9A:
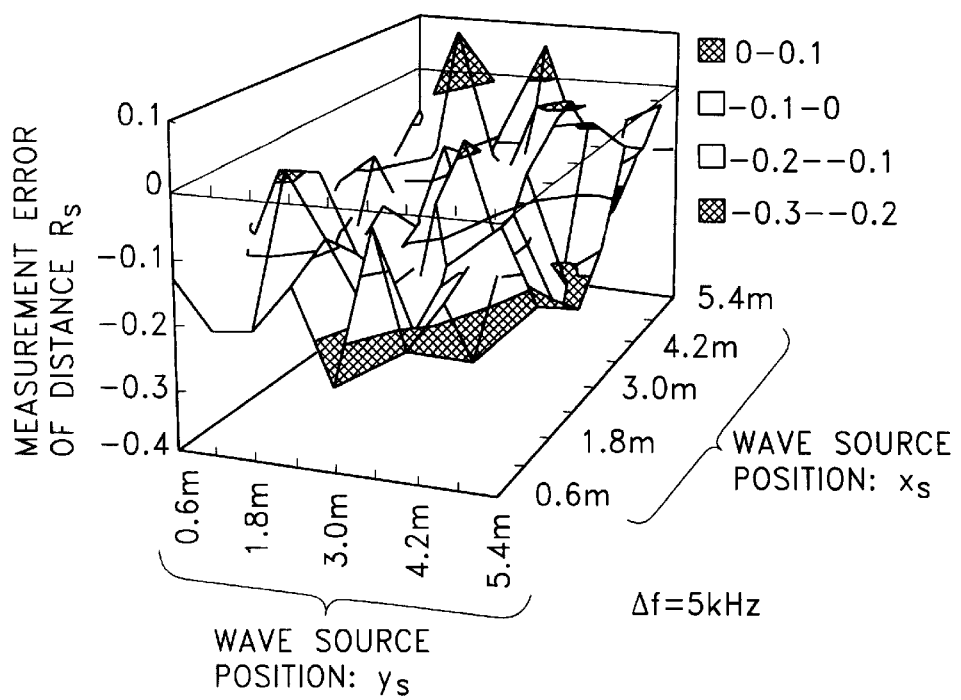
FIG. 9A and 9B are a graphs each showing a result obtained by simulating a relation between a frequency difference and a distance measurement error.
Figure 9B:
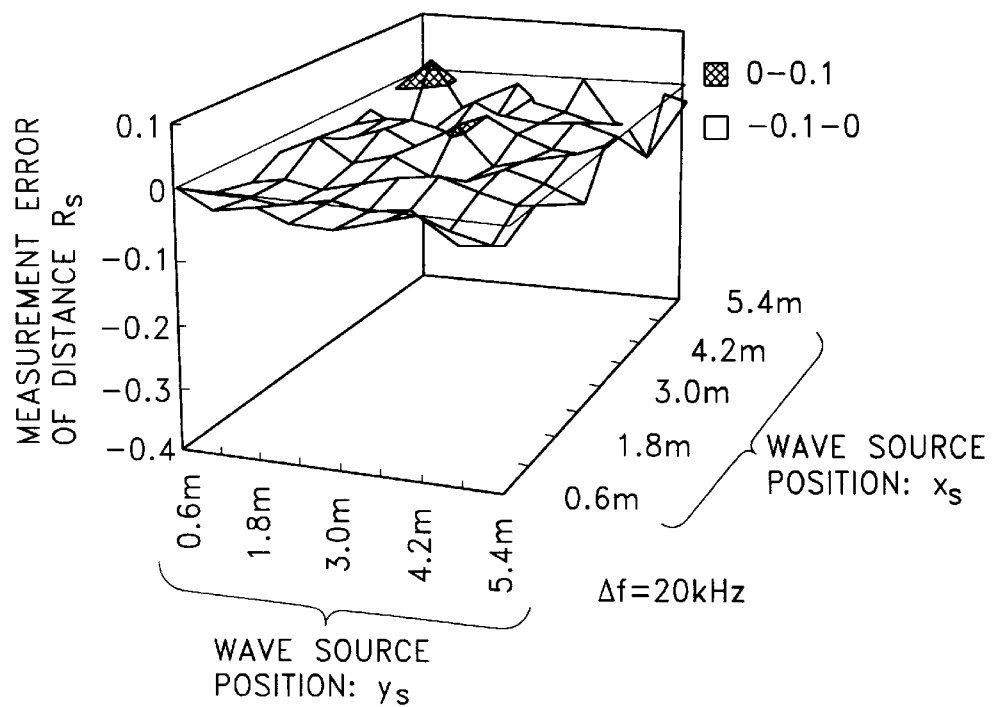

Moreover, the frequency difference $\Delta f$ between the two frequencies used in the two-frequency hologram observation and the distance measurement error were examined by means of computer simulations. The simulation was conducted under the conditions that the position of the primary wave source was at $x_0=y_0=0$ m and $z_0=5$ m, $z_s=8$ m, the size of the hologram observation plane was 57 cm square, the observation frequency $f_s$ was 10 GHz, and S/N (signal-to-noise ratio) was 8 dB. The simulation results are shown in FIG. 9A and FIG. 9B as the error in the distance $R_s$ between the origin O and the mirror wave source. FIG. 9A shows the simulation results when the frequency difference $\Delta f$ was 5 MHz. FIG. 9B show the simulation results when the frequency difference $\Delta f$ was 20 MHz. Under the condition that S/N is 8 dB, if $\Delta f$ is 5 MHz, the error range is 40 cm at a measurement range of ±30 m and if $\Delta f$ is 20 MHz, the error range is 10 cm at a measurement range of ±7.5 m.

As has been shown by the measurement values and the simulation examples, using the two-frequency hologram observation, in spite that noises are contained on observation, the excellent distance measurement accuracy can be achieved if the frequency difference $\Delta f$ between the two frequencies used for the observation and the observation distance range are suitably selected. The present invention compensates the various kinds of observation errors, using such high distance measurement accuracy in the two-frequency hologram observation. The vector effective length of the prove antenna can be accurately obtained using a moment method. Moreover, the transfer function between the observation plane and the wave source point can be accurately obtained using the three-dimensional dyadic Green function.

Figure 3A:
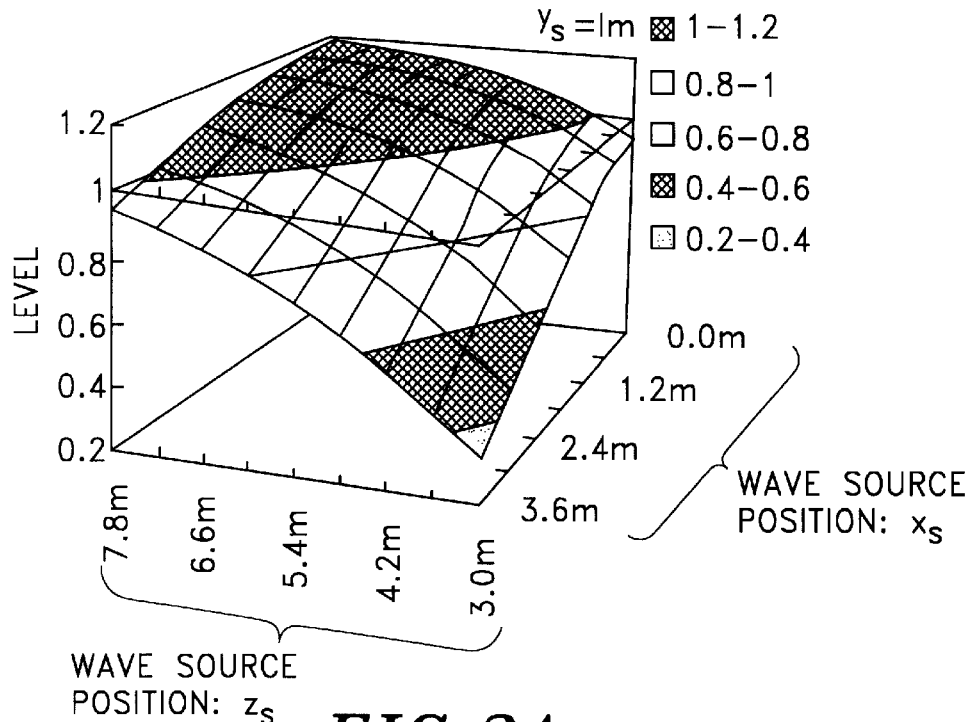
FIG. 3A is a graph showing a reconstructed amplitude of a wave source obtained by the conventional method.
Figure 3B:
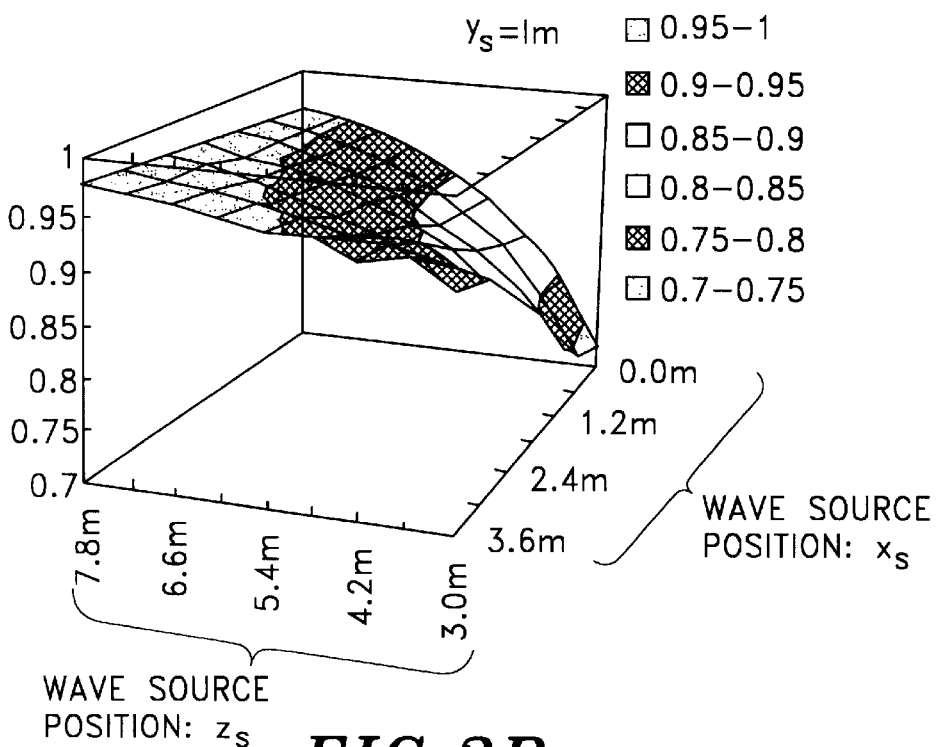
FIG. 3B is a graph illustrating a reconstructed amplitude in the case where only a directivity of an antenna is compensated.

Therefore, in the present invention, the position of the wave source is estimated using the equations (2.1) to (2.10), the estimation of the observation value for the unit current is performed using the equations (1.1) to (1.6), and the comparison of the result of the image reconstruction using the equation (2.5) with the result of the image reconstruction which is obtained by an actual measurement is performed. By performing such comparison, it will be possible to obtain the true complex amplitude of the wave source. Compared to the conventional method the results of which are shown in FIG. 3A and FIG. 3B, according to the present invention, the error is reduced to under 5 dB from 10 dB in the conventional method as shown in FIG. 8B.

In this embodiment of the present invention described above, when the observed electric field is synthesized in the step 105, the directivity of the antenna and the spread of the reconstructed image are considered by usage of the equation (1.1) to (1.6). The present invention is not limited to this, approximation by considering only the vector effective length in the wave source direction when viewed from the hologram observation plane, that is, approximation by making the directivity constant for every wave source can be conducted.

As described above, the case of the radio wave hologram observation was exemplified. As a matter of course, the present invention can be applied to other kinds of waves, for example, observations of a wave source distribution by an acoustic wave hologram.

In the hologram observation method of this embodiment of the present invention, the virtual unit wave source is disposed in the wave source position extracted from the hologram image observed thereby synthesizing the observed wave, and the reconstructed image obtained from the synthesizing result is compared with the reconstructed image actually measured, whereby the true complex amplitude of the wave source can be obtained. Moreover, the area where the intensity is more than a predetermined value in the reconstructed image as the result of synthesizing the observed wave is excluded and a computation is repeatedly performed, whereby the extraction of the pseudo wave source due to the spread of the image can be prevented and the wave source amplitude and the wave source distribution can be more accurately obtained. In the analysis of the electromagnetic wave propagation, the comprehension of the complicated multiple wave for every frequency used is inevitable for a security of the radio communication quality and a prevention of the interference trouble. In the hologram observation method of the present invention, by collectively and accurately evaluating the plurality of reflection points causing the multiple wave propagation and reflection coefficient, the prevention of the above described troubles and security of the quality can be achieved.

Figure 10:
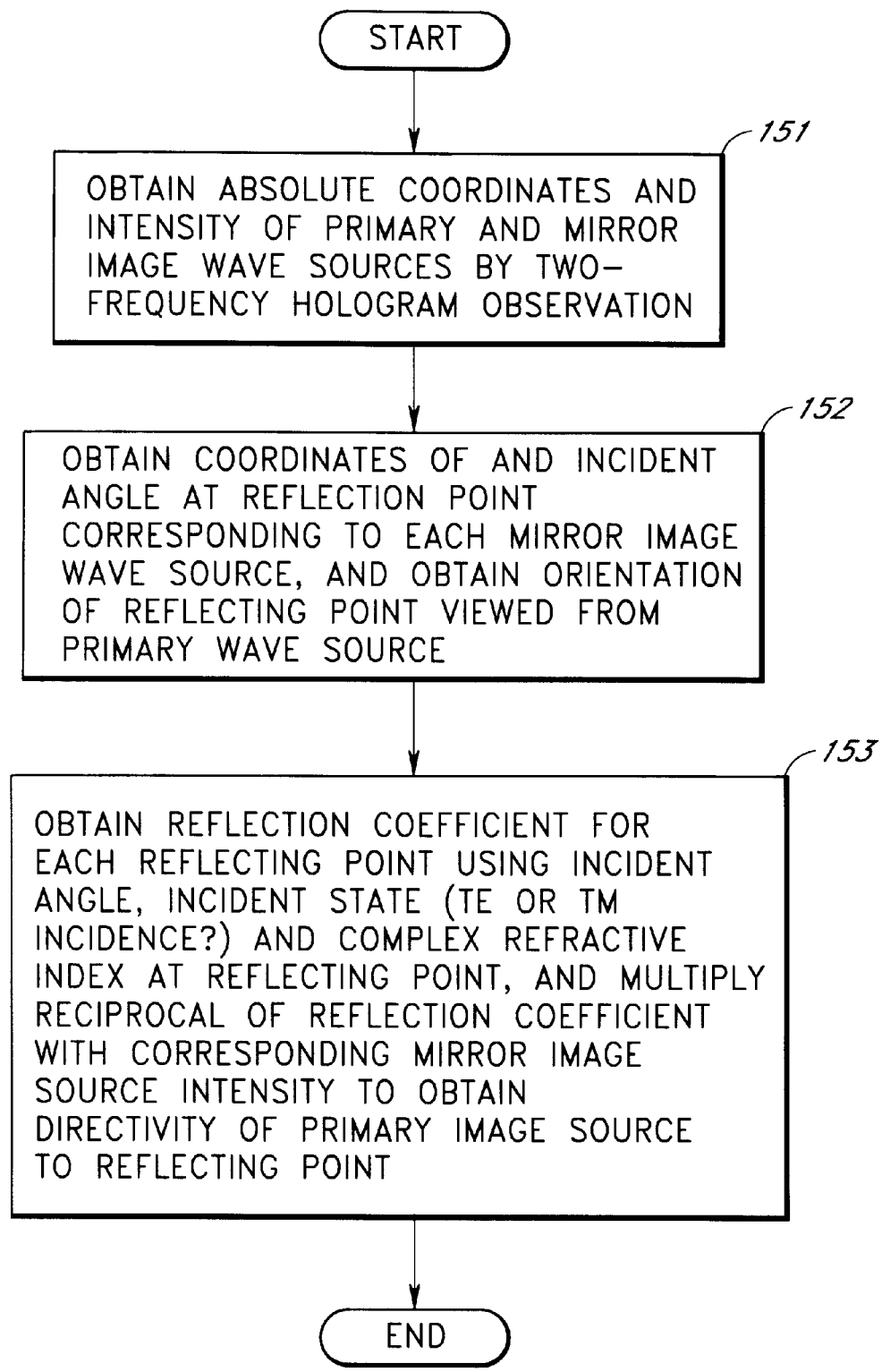
FIG. 10 is a flow chart showing procedures of a method to estimate a stereoscopic directivity of an antenna.

Next, the estimation method for the stereoscopic directivity of the antenna utilizing the two-frequency hologram observation will be described. FIG. 10 is a flow chart showing procedures when the stereoscopic directivity of the antenna is estimated according to the directivity estimation method of the present invention.

First, the measured antenna such as the base station antenna is set to a working state, and this measured antenna is used as a primary wave source. Then, in the step 151, by observing the radio wave hologram the three-dimensional absolute coordinates of the primary wave source and mirror image wave sources corresponding to the primary wave source and the intensities thereof are obtained. The mirror image wave source is a wave source which is apparently visible beyond the reflection body from the observation point, namely, a reflection wave source. Therefore, an intensity of the primary wave source means that of the direct wave which is incident onto the observation point from the primary wave source, and an intensity of the mirror image wave source means that of the reflection wave which is incident onto the observation point from the primary wave source via the reflection point. In this embodiment, the two-frequency hologram observation method is used, in which the hologram observation plane is disposed at a suitable observation point where the primary wave source can be looked out over, and the hologram reconstruction image at the two different frequencies is obtained, thereby obtaining the three-dimensional wave source distribution. Although the two-frequency hologram observation method disclosed in JP,A, 08201459 document can be adopted as the one to be used in this embodiment, the foregoing hologram observation method of the present invention should be preferably adopted. Specifically, it should be preferable that the virtual unit current source (virtual unit wave source) is disposed at the position of the wave source extracted from the observed hologram image, thereby synthesizing the observed electric field, and the reconstructed image produced from the synthesizing result is compared with the actually measured reconstructed image, thereby obtaining the true complex amplitude of the wave source and estimating the position of the wave source with a higher accuracy. The use of the foregoing hologram observation method of the present invention makes it possible to accurately obtain the three-dimensional coordinates of the primary wave source and mirror image wave source and the intensities thereof.

Figure 1:
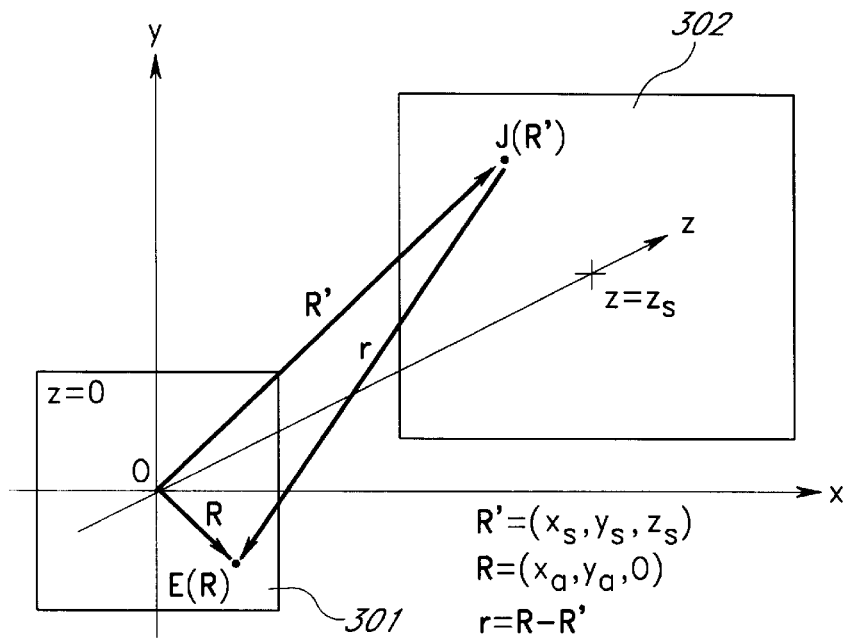
FIG. 1 is a diagram for illustrating a hologram observation model.
Figure 2:
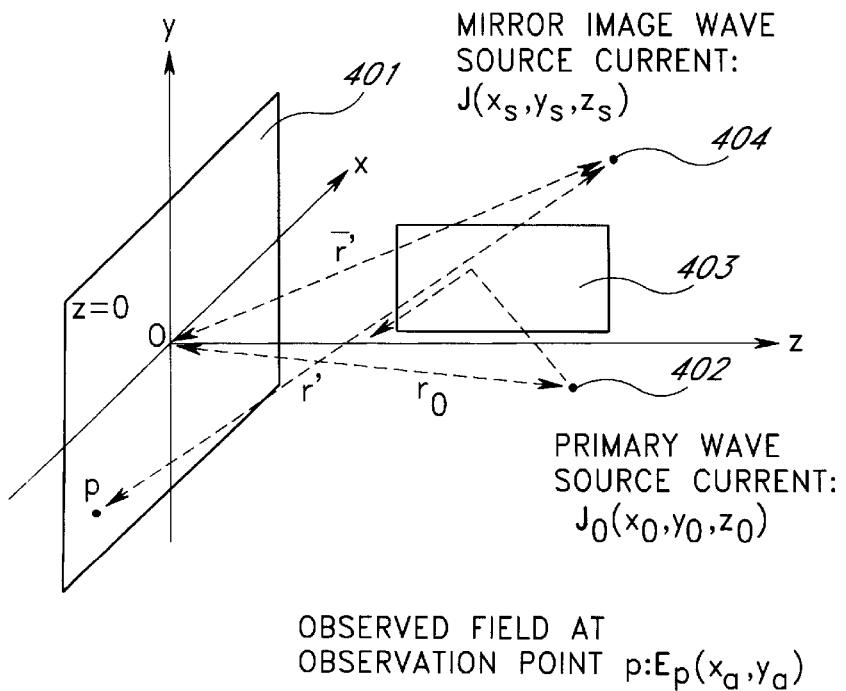
FIG. 2 is a diagram for illustrating a mirror image observation model.
Figure 11A:
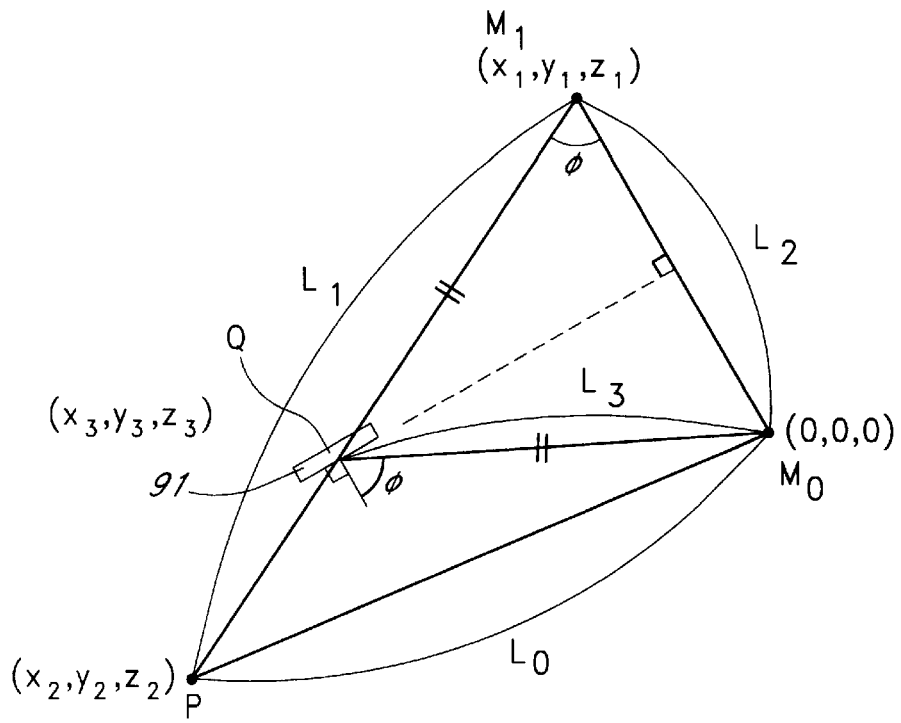
FIG. 11A is a diagram showing an example of arrangements of an observation point, a primary wave source, a reflection point and a mirror image wave source.

Next, in the step 152, from the coordinates of the primary wave source and the mirror image wave sources, the coordinates of the reflection point, the incidence angle at the reflection point, and the stereoscopic direction of the reflection point when viewed from the primary wave source are obtained. For example, as shown in FIG. 11A, the coordinates of the primary wave source Mo such as the base station antenna shall be (0, 0, 0), the coordinates of the position of the mirror image wave source, that is, the mirror image point $M_1$, shall be $(x_1, y_1, z_1)$, the coordinates of the observation point P (the center of the hologram observation plane) shall be $(x_2, y_2, z_2)$, and the coordinates of the reflection point Q on the reflection surface of the building or the like shall be $(x_3, y_3, z_3)$. Moreover, the distance between the primary wave source $M_0$ and the observation point P shall be set to $L_0$, the distance between the observation point P and the mirror image point $M_1$ shall be set to $L_1$, the distance between the primary wave source $M_0$ and the mirror image point $M_1$ shall be set to $L_2$, and the distance between the primary wave source $M_0$ and the reflection point Q shall be set to $L_3$. In FIG. 11A, it should be noted that the primary wave source $M_0$ is used as an origin (0, 0, 0), unlike the case of FIG. 1. Then, the distances $L_0$, $L_1$, and $L_2$ are expressed by the following equations (6.1), (6.2) and (6.3).

$$L_0 = \sqrt{x_2^2 + y_2^2 + z_2^2} \quad (6.1)$$

$$L_1 = \sqrt{(x_1 - x_2)^2 + (y_1 - y_2)^2 + (z_1 - z_2)^2} \quad (6.2)$$

$$L_2 = \sqrt{x_1^2 + y_1^2 + z_1^2} \quad (6.3)$$

Moreover, since the distance between the reflection point Q and the mirror image point $M_1$ is equal to $L_3$, the triangle $\Delta M_0 M_1 Q$ is an equilateral triangle and an incidence angle $\phi$ at the reflection point Q is equal to the angle $\angle M_0 M_1 Q$. Here, the incidence angle $\phi$ is expressed as an angle from the normal line to the reflection plane 91.

The direction cosine of the primary wave source $M_0$ when viewed from the mirror image point $M_1(x_1, y_1, z_1)$ shall be $(l_1, m_1, n_1)$, and the direction cosine of the observation point P when viewed from the mirror image point $M_1(x_1, y_1, z_1)$ shall be $(l_2, m_2, n_2)$. These direction cosines satisfy the following relations.

$$l_1 = \frac{-x_1}{L_2}, m_1 = \frac{-y_1}{L_2}, n_1 = \frac{-z_1}{L_2} \quad (6.4)$$

$$l_2 = \frac{x_2 - x_1}{L_1}, m_2 = \frac{y_2 - y_1}{L_1}, n_2 = \frac{z_2 - z_1}{L_1} \quad (6.5)$$

Therefore, from the following equations (6.6) and (6.7), $$\cos \phi = l_1 l_2 + m_1 m_2 + n_1 n_2 \quad (6.6)$$

$$\sin \phi = \sqrt{\left|\begin{matrix}l_1 m_1 \\ l_2 m_2\end{matrix}\right|^2 + \left|\begin{matrix}m_1 n_1 \\ m_2 n_2\end{matrix}\right|^2 + \left|\begin{matrix}n_1 l_1 \\ n_2 l_2\end{matrix}\right|^2} \quad (6.7)$$

the incidence angle $\phi$ at the reflection point Q can be obtained. Here, since the following equation (6.8)

$$L_3 = \frac{L_2}{2 \cdot \cos \phi} \quad (6.8)$$

is established, the coordinates $(x_3, y_3, z_3)$ of the reflection point Q can be obtained as the following equations (6.9), (6.10) and (6.11).

$$x_3 = \frac{L_1 - L_3}{L_1}(x_1 - x_2) + x_2 \quad (6.9)$$

$$y_3 = \frac{L_1 - L_3}{L_1}(y_1 - y_2) + y_2 \quad (6.10)$$

$$z_3 = \frac{L_1 - L_3}{L_1}(z_1 - z_2) + z_2 \quad (6.11)$$

Moreover, the direction cosine $(l_3, m_3, n_3)$ of the reflection point Q when viewed from the primary wave source $M_0$ is expressed by the following equation (6.12).

$$l_3 = \frac{x_3}{L_3}, m_3 = \frac{y_3}{L_3}, n_3 = \frac{z_3}{L_3} \quad (6.12)$$

As described above, described was the method for obtaining the coordinates of the reflection point, the incidence angle and the direction of the reflection point when viewed from the primary wave source, from the coordinates of the primary wave source and the mirror image wave sources. In the actual two-frequency hologram observation, a plurality of mirror image wave sources are often observed in one observation point. In such case, the coordinates of the reflection point should be obtained for every each mirror image wave source.

When the coordinates of the reflection point, the incidence angle, and the direction of the reflection angle when viewed from the primary wave source are obtained, the incidence angle and the incidence state [a TE reflection or a TM (transverse magnetic wave) reflection], at each reflection point are obtained, and the reflection coefficient is obtained from the complex refractive index. Then, in the step 153, the reciprocal number of the reflection coefficient is multiplied with the intensity of the wave source of the corresponding one among the mirror image wave sources which have been already obtained in the step 151. The obtained value is used as the directivity in the reflection direction of the primary wave source. The reflection coefficients R are expressed in cases of the TE incidence and the TM incidence by the following equations (6.13) and (6.14), respectively, when the complex refractive index at the reflection point is assumed to be n.

$$R \cong \frac{\cos \phi - n}{\cos \phi + n} \quad (TE \text{ incidence}) \quad (6.13)$$

$$R \cong \frac{n \cos \phi - 1}{n \cos \phi + 1} \quad (TM \text{ incidence}) \quad (6.14)$$

The description will be concretely made using foregoing FIG. 11A. It is assumed that the intensity of the direct wave from the primary wave source $M_0$ is $I_0$ and the intensity of the reflection wave which virtually looks as if it comes from the mirror image wave source $M_1$ is $I_1$. Assuming that the directivity in the observation point direction of the primary wave source [direction cosine $(l_2, m_2, n_2)$] is $E_0$, the directivity $E_1$ in the direction of direction cosine $(l_3, m_3, n_3)$, that is, the direction of the reflection point P, is expressed by the following equation (6.15).

$$E_1 = \frac{I_1}{|R|} \quad (6.15)$$

Since the plurality of mirror image wave sources can be generally seen by the observation at one observation point, the directivity in each of the mirror image point directions from the primary wave source can be obtained by the observation which is once performed at this observation point. Moreover, the directivities in many directions as to the primary wave source can be obtained by moving the observation point.

Figure 11B:
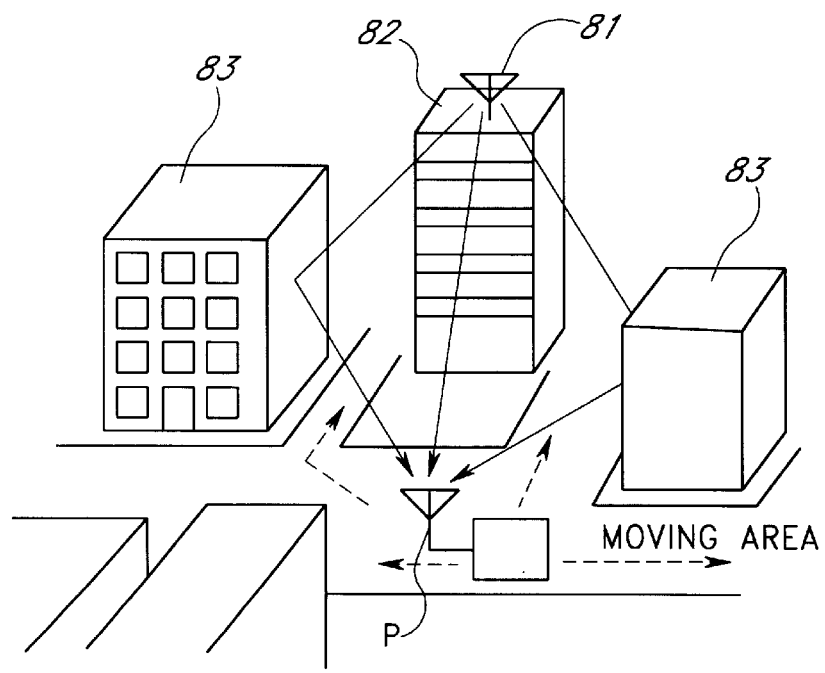
FIG. 11B is a diagram showing an example of an arrangement for actual observation.

FIG. 11B is a perspective view showing an example of the observation arrangement in the case where the primary wave source $M_0$ is the base station antenna 81 in the mobile communication system. The base station antenna 81 is disposed on the rooftop of the building 82, at the center of the figure. Onto the observation point P disposed on the road, incident are the direct wave from the base station antenna 81 and the reflection wave reflected by the surrounding buildings 83, that is, the wave from the mirror image wave sources. By moving the observation point P on the road, the stereoscopic directivities in many directions can be obtained for the base station antenna 81.

In a mobile communication system, a vertically polarized radio wave is often used. Such polarization wave shows a TE incidence against a side wall of a building which is approximately a vertical plane. When the side wall of the building is made of concrete, influence of an incidence angle $\phi$ on a reflection coefficient R is small, so that the reflection coefficient R can be dealt with as a fixed number. If the reflection coefficient R is dealt with as a fixed number, the amount of computations can be reduced.

The antenna directivity obtained by the foregoing embodiment of the present invention is information concerning points in a plurality of directions. For example, using a three-dimensional spline interpolation method, the antenna directivity can be also dealt with as a smooth curved surface. As to the concrete method of the three-dimensional spline interpolation, there is a recitation, for example, in D. F. Rogers, J. A. Adams, "Mathematical Elements for Computer Graphics", McGraw-Hill (translated into Japanese by Fujio Yamaguchi, Nikkan Kogyo Newspaper Publishing Company).

If the directivity of the primary wave source on the transmission side has been accurately obtained, it is possible to accurately estimate the complex reflective index and reflection coefficient of the side wall of the building, by using the method of the present invention. Since the error of about 3 dB is normally permitted when the directivity of the antenna is obtained, a very accurate reflection coefficient is unnecessary. However, accurate data concerning the antenna directivity is necessary when the reflection coefficient is estimated.

In the estimation method of the antenna stereoscopic directivity described above, the two-frequency hologram observation is performed by receiving the direct wave and the reflection wave from the primary wave source, and the stereoscopic directivity of the primary wave source is estimated from the obtained wave source intensity and the orientation of the reflection point. According to this method, the stereoscopic directivity of the antenna in an actual working state can be accurately estimated by utilizing the reflection wave positively, even when the observation point can be disposed only in a limited place such as a street.

Figure 12:
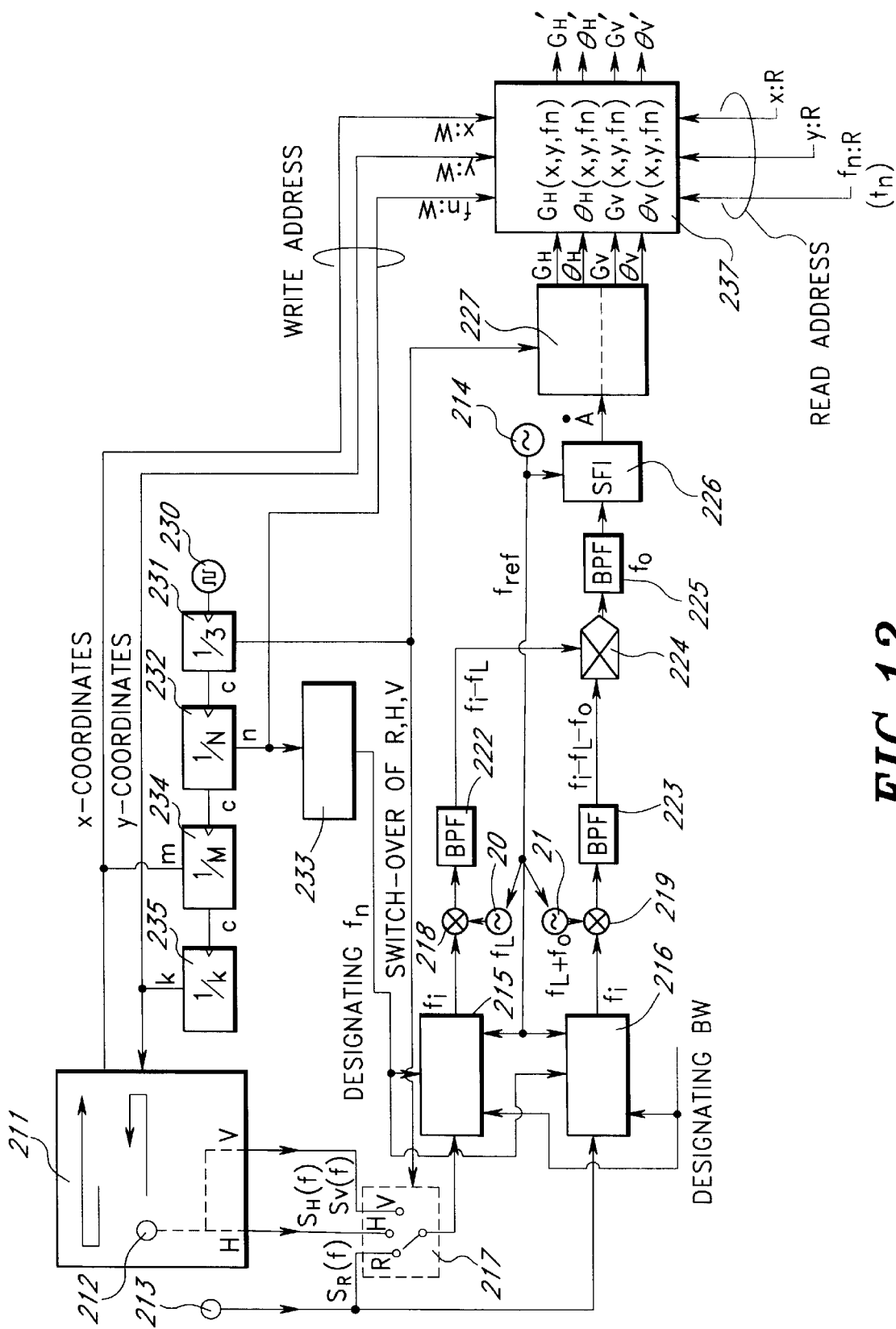
FIG. 12 is a block diagram showing a constitution of a measurement unit of a wave distribution visualizing apparatus according to another embodiment of the present invention.
Figure 13:
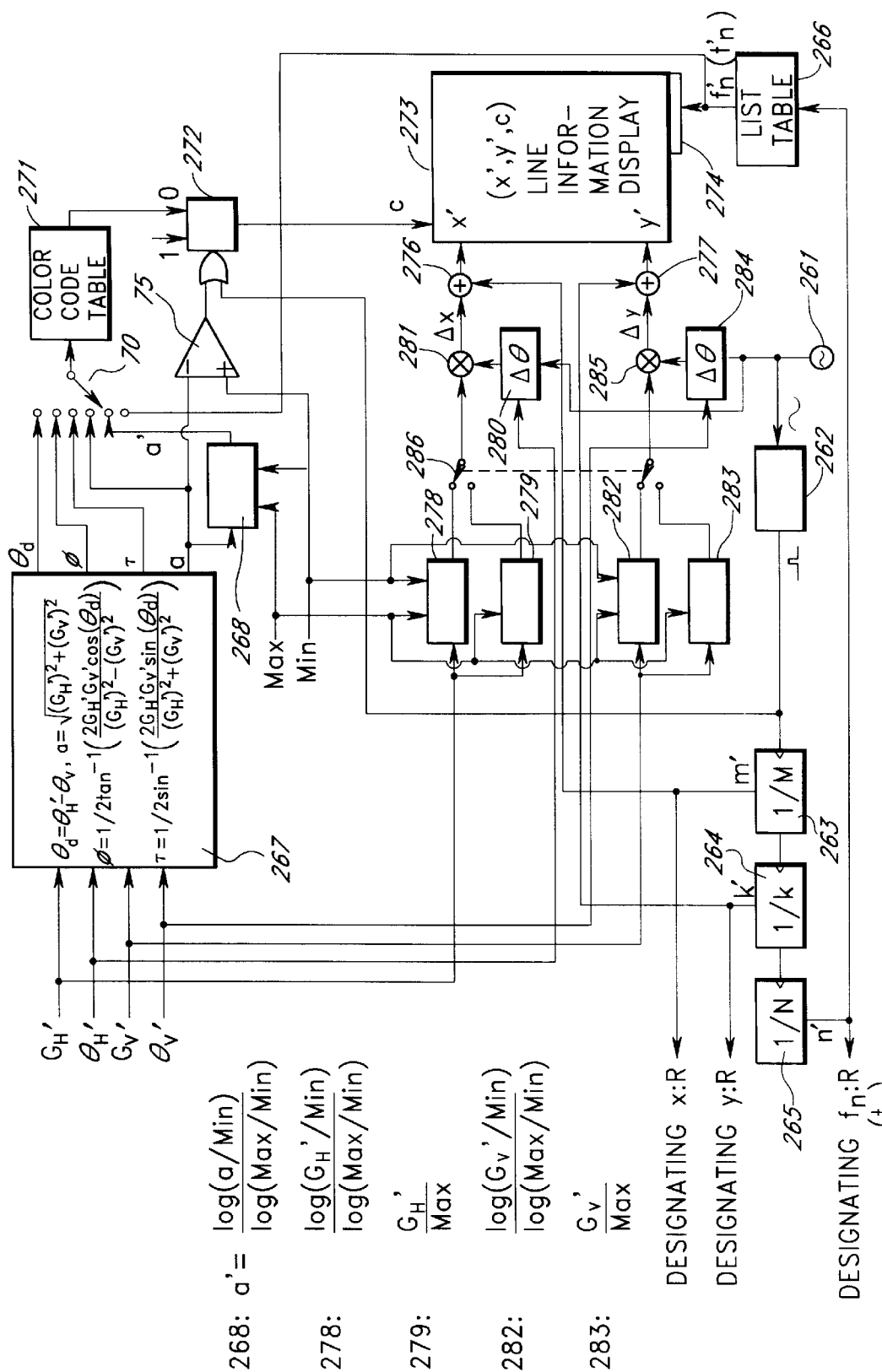
FIG. 13 is a block diagram showing a constitution of a display unit of the wave distribution visualizing apparatus.

Next, a wave distribution observation method of another embodiment of the present invention will be described. A wave distribution visualizing apparatus to be used in the present embodiment observes the wave distribution to concurrently visualize and display the observed wave distribution. FIG. 12 shows a structure of a measurement unit of the wave distribution visualizing apparatus and FIG. 13 shows a structure of a display unit of the wave distribution visualizing apparatus.

In the measurement unit, a hologram observation plane 211 is disposed in such a manner to face an observation objective while having a scanning antenna 212 provided thereon to run for scanning. The scanning antenna 212 receives electromagnetic waves from the observation objective and outputs the observed signals separately in the form of a horizontal polarization component (H) and a vertical polarization component (V). Now, in the following description, the hologram observation plane 211 is assumed that it is a part of an xy-plane in the three-dimensional xyz-coordinates space. Here, the hologram observation plane 211 is further assumed that it is composed of a xy-coordinates stage and the scanning antenna 212 moves thereon in the x-direction and the y-direction instructed by a control signal inputted to the xy-coordinates stage. However, the scanning antenna 212 may be made in a form of a reception antenna array to construct the hologram observation plane 211. In any case, horizontal and vertical polarization components received at an arbitrary point (x, y) on the hologram observation plane 211 are outputted as observed signals $S_H(f)$, $S_V(f)$, respectively. Here, symbol f represents a frequency.

On a position slightly apart from the hologram observation plane 211, a fixed antenna 213 is provided for similarly receiving electromagnetic waves from the observation objective and outputting them as a observed signal $S_R(f)$. For the purpose of obtaining a two-dimensional complex interferogram, it is possible to apply a structure which directly receives the signal $S_R(f)$ from the observation objective, instead of providing the fixed antenna 213. The fixed antenna 213 serves as a first sensor and the scanning antenna 212 serves as a second sensor.

A reference frequency source 214 is provided for generating a reference frequency signal $f_{ref}$ to be supplied to the whole reception system of the wave distribution visualizing apparatus. Further, two filtering sections 215 and 216 are provided to control the bandwidth of the observed signals to observation center frequency $f_n$, bandwidth BW and to convert the observed signals to the signals of the intermediate frequency $f_i$ (for example, 21.4 MHz) through frequency conversion. Into the filtering section 215, a signal selected by a change-over switch 217 from among the observed signals $S_R(f)$, $S_H(f)$ and $S_V(f)$ is inputted, and into the other filtering section 216, the observed signal $S_R(f)$ is inputted. As described later, the change-over switch 217 is controlled by a switching signal illustrated as "change-over of R, H, V". These filtering parts 215 and 216 are realized, for example, by operating spectrum analyzers of phase locked to the reference frequency signal $f_{ref}$ with zero span mode. Bandwidth BW of the filtering sections 215 and 216 can be set from outside, and each value is, for example, in a range of 10 Hz to 3 MHz. Also as described later, the observation center frequency $f_n$ is controlled by an output from an observation frequency list table 233, however, for example, the observation center frequency $f_n$ is in the range of 0 Hz to 26.5 GHz. A phase-locked loop is contained in each of the filtering sections 215 and 216 for allowing the filtering section to operate on a variable observation center frequency $f_n$ while being phase-locked to the reference frequency signal $f_{ref}$.

On the output side of the filtering sections 215 and 216, mixers 218 and 219 are provided, respectively, receiving respective local oscillation signals with frequency $f_L$ and frequency $f_L+f_0$ transmitted from local oscillators 220 and 221, respectively, which are phase-locked to the reference frequency signal $f_{ref}$. Here, for example, frequency $f_0$ is set approximately to 1 MHz. On the output side of the mixer 218, a band pass filter 222 is provided with bandwidth of the above BW and a center frequency of $f_i-f_L$. On the output side of the other mixer 219, a band pass filter 223 is provided with bandwidth of the above BW and a center frequency of $f_i-f_L-f_0$. The output of two band pass filters 222 and 223 are inputted to a multiplier 224. Consequently, the observed signal selected by the change-over switch 217 and then frequency converted is multiplied by the other observed signal $S_R(f)$ processed through frequency conversion, in the multiplier 224. The output from the multiplier 224 is inputted into an SFI (Synthesized Fourier Integration) vector detector 226 which performs the vector detection (at frequency $f_0$) according to synthesized Fourier integration, through a band pass filter 225 of a narrow bandwidth and a center frequency $f_0$. The reference frequency signal $f_{ref}$ is also supplied to the SFI vector detector 226 which has a structure the same as that shown in FIG. 6. The vector detection output $\dot{A}$ form the SFI vector detector 226 is inputted to an interference calculation section 227 which is to be described later.

Next, description will be made with reference to a structure of the wave distribution visualizing apparatus arranged for switching the observation center frequency $f_n$ and controlling the position of the scanning antenna 212.

There is provided a pulse generator 230 for generating a measurement period pulse which is to be inputted to a ternary counter 231. The ternary output from the ternary counter 231 is a switching signal for "change-over of R, H, V" and is used for controlling the switching operation of the change-over switch 217, and together inputted into the interference calculation section 227. Carry C of the ternary counter 231 is inputted to an N-ary counter 232, where N is a natural number of 2 or more. An N-ary output n from the N-ary counter 232 is used for switching the observation center frequency $f_n$. In concrete, an observation frequency list table 233 is provided for storing a list comprising a plurality of observation frequencies which are objects of switching. The observation frequency list table 233 selects some frequency corresponding to the value of the output n from the N-ary counter 232, and outputs a list including a signal for indicating the selected observation center frequency to each of the filtering sections 215 and 216.

On the other hand, there are provided an M-ary counter 234 and a K-ary counter 235 for controlling the position of the scanning antenna 212 on the hologram observation plane 211, where M and K are both natural numbers of 2 or more. Carry C of the N-ary counter 232 is inputted to the M-ary counter 234, and the carry of the M-ary counter 234 is inputted to the K-ary counter 235. An M-ary output m of the M-ary counter 234 is used for determining x-coordinates of the scanning antenna 212, and a K-ary output k of the K-ary counter 235 is used for determining y-coordinates of the scanning antenna 212. Now, if the hologram observation plane 211 is composed of an xy-stage as described above, output m of the M-ary counter 234 and output k of the K-ary counter 235 are inputted to the xy-stage as control signals, respectively.

By constituting in this way, it becomes possible to successively perform the observation for a series of a plurality of observation center frequencies, while the scanning antenna 212 resides on a coordinate point on the hologram observation plane 212. In this case, when one observation center frequency is observed on one coordinate point, the change-over switch 217 is switched making a round through three observation signals $S_R(f)$, $S_H(f)$ and $S_F(f)$ being activated by the output from the ternary counter 231. Observation time for each observation signal is equivalent to one period of the measurement frequency pulse to be outputted from the pulse generator 230.

As described above, the change-over switch 217 is switched for every coordinates point and every observation center frequency, and if the change-over switch 217 selects the observation signal $S_R(f)$ and a mark * represents a complex conjugate, the vector detection output $\dot{A}$ from the SFI vector detector 226 is given by, $$\dot{A}_R = \int_{f_n-BW/2}^{f_n+BW/2} S_R*(f)S_R(f)e^{j\theta_f} df \quad (7.1)$$

If the change-over switch 217 selects the observation signal $S_H(f)$, the vector detection output is given by, $$\dot{A}_H = \int_{f_n-BW/2}^{f_n+BW/2} S_R*(f)S_H(f)e^{j\theta_f} df \quad (7.2)$$

If the change-over switch 217 selects the observation signal $S_F(f)$, the vector detection output is given by, $$\dot{A}_V = \int_{f_n-BW/2}^{f_n+BW/2} S_R*(f)S_V(f)e^{j\theta_f} df \quad (7.3)$$

where, (x, y) represent the coordinates of the scanning antenna 212, $\theta_f$ represents a PLL lock phase offset to be produced when the observation center frequency is switched.

These three vector detection output $\dot{A}_R$, $\dot{A}_H$, $\dot{A}_V$ correspond to a first correlation value, a second correlation value, a third correlation value, respectively, and are inputted to the interference calculation section 227. The interference calculation section 227 calculates complex values $C_H(x, y, f_n)$ and $C_V(x, y, f_n)$ for horizontal and vertical polarization components, respectively, as follows.

$$C_H(x, y, f_n) = \frac{\dot{A}_H}{\dot{A}_R}\sqrt{|\dot{A}_R|} \quad (7.4)$$

$$C_V(x, y, f_n) = \frac{\dot{A}_V}{\dot{A}_R}\sqrt{|\dot{A}_R|} \quad (7.5)$$

The interference calculation section 227 outputs the amplitude and phase of $C_H(x, y, f_n)$ as $G_H(x, y, f_n)$ and $\theta_H(x, y, f_n)$, respectively, and outputs the amplitude and phase of $C_V(x, y, f_n)$ as $G_V(x, y, f_n)$ and $\theta_V(x, y, f_n)$, respectively. These $G_H(x, y, f_n)$, $\theta_H(x, y, f_n)$, $G_V(x, y, f_n)$ and $\theta_V(x, y, f_n)$ are stored in a data memory 237 as interference observation data.

The data memory 237 stores the above amplitudes GH and $G_V$ and phases $\theta_H$ and $\theta_V$ for every coordinates (x, y) of the observation frequency $f_n$ and the scanning antenna 212, and is structured so that a write address and a read address can separately be inputted thereto. In other words, an output n of the N-ary counter 232, an output m of the M-ary counter 234 and an output k of the K-ary counter 235 are inputted to data memory 237 in parallel for designating $f_n$, x, y as write addresses, respectively. In the figure, "W" represents a write address. Into the data memory 237, signals for designating $f_n$, x, y are inputted from a later described display unit in parallel as read addresses. "R" in the figure represents a read address. When a read address is designated, $G_H'(x, y, f_n)$, $\theta_H'(x, y, f_n)$, $G_V'(x, y, f_n)$ and $\theta_V'(x, y, f_n)$ are outputted from the data memory 237 as interference observation data for designated $f_n$, x, y. Since the write address and the read address can be designated separately, the data read from the data memory 237 is distinguished from the write data by attaching symbol "'".

Further, the data memory 237 comprises a processing mechanism for reconstructing a hologram image, and if there is a request, outputs the amplitudes and phases of the reconstructed hologram image as $G_H'(X, Y, f_n)$, $\theta_H'(X, Y, f_n)$, $G_V'(X, Y, f_n)$ and $\theta_V'(X, Y, f_n)$, instead of the above amplitudes $G_H$ and $G_V$ and the phases $\theta_H$, and $\theta_V$, where X, Y represent two-dimensional coordinates of the observation objective. The reconstructed hologram image expresses the wave distribution (i.e., wave source image) on the surface of the observation objective, and by designating coordinates (X, Y), an arbitrary point on the observation objective can be designated. Data (X, Y) is supplied to the data memory 237 as (x, y) in the address read from the display unit.

In the present embodiment, by calculating the interference observation data in interference calculation section 227 based on equations (7.4) and (7.5), factor eiaf included in integral equation (7.2) and, (7.3) is canceled. Therefore, the influence of a phase lock offset included within phase-locked loop caused by the switching of the observation frequency is canceled. Further, the amplitude of the observed signal $S_R(f)$ is prevented from affecting the interference observation data and can give only the reference phase. In other words, even if the observation frequency is switched to others, it is possible to perform the evaluation of the absolute phase. Further, it is possible to perform the reconstruction operation to the hologram image using the interference observation data of the data memory 237, and also possible to obtain the time response through inverse Fourier transform of the interference observation data executed with reference to the observation frequency $f_n$. However, time $t_n$ is used in place of frequency $f_n$ as a read address in the case of obtaining the time response.

Next, the constitution of the display unit of the wave distribution visualizing apparatus will be described with reference to FIG. 13.

Now, a display sine-wave signal generator 261 is provided for generating a sine-wave signal which constitutes the reference for the operation of the whole display unit. A synchronizing pulse generator 262 is also provided for receiving the sine-wave signal. In synchronization with the sine-wave signal, the synchronizing pulse generator 262 generates the synchronizing pulse to be used for producing a read address which is to be supplied to the data memory 237 (FIG. 12). Since the write address and the read address can independently be inputted to the data memory 237, the frequency and the phase of the sine-wave signal can be determined independent of the reference frequency signal $f_{ref}$ of the measurement unit.

A synchronizing pulse from the synchronizing pulse generator 262 first inputs to an M-ary counter 263, and the M-ary output m' of the M-ary counter 263 is used for designating x-coordinates of the interference observation data. Carry C of the M-ary counter 263 inputs to a K-ary counter 264, and a K-ary output k' of the K-ary counter 264 is used for designating y-coordinates of the interference observation data. Further, Carry C of the K-ary counter 264 inputs to an N-ary counter 265, and an N-ary output n' of the N-ary counter 265 is used for designating observation center frequency $f_n$ (or time $t_n$) of the interference observation data. An observation frequency list table 266 similar to the observation frequency list table 233 of the measurement unit is provided. The observation frequency list table 266 receives the output n' of the N-ary counter 265 and outputs an observation center frequency $f_n$ which corresponds to the output n'. In the case of performing analysis based on the result of time responses, a time list table may be provided instead of the observation frequency list table 266 for storing time $t_n$ corresponding to each observation center frequency $f_n$ so that time $t_n'$ can be outputted corresponding to the value of output n'. Here, it is preferable to get the value of these M, K, N equivalent to the value of M, K, N of the M-ary counter 234, the K-ary counter 235 and the N-ary counter 232 in the measurement unit, respectively. However, in the case of reading a hologram reconstruction image from the data memory 237, the value of this M, K can be determined considering the number of coordinates points of the reconstructed image. The sequential order of the M-ary counter 263, the K-ary counter 264 and the N-ary counter 265 is not limited to the order described here, and also not limited to the connection sequence of the counters 232, 234 and 235 in the measurement unit.

The values x, y and $f_n$ (or $t_n$) outputted from each counter 263 to 265 are inputted to the data memory 237 as the read address, and accordingly $G_H'(x, y, f_n)$, $\theta_H'(x, y, f_n)$, $G_V'(x, y,$ $f_n$) and $\theta_V'(x, y, f_n)$ are supplied from the data memory 237 to the display unit as the interference observation data. Particularly when such as the current distribution on the observation objective surface is analyzed, the amplitude or the phase of the hologram reconstruction images are inputted as $G_H'(x, y, f_n)$, $\theta_H'(x, y, f_n)$, $G_V'(x, y, f_n)$ and $\theta_V'(x, y, f_n)$. In the following description, $G_H'(x, y, f_n)$, $\theta_H'(x, y, f_n)$, $G_V'(x, y, f_n)$, $\theta_V'(x, y, f_n)$ are expressed as $G_H'$, $\theta_H'$, $G_V'$ and $\theta_V'$, respectively.

These $G_H'$, $\theta_H'$, $G_V'$ and $\theta_V'$ are first inputted to a polarization state calculation section 267, and then $\theta_d$, $\phi$, $\tau$ and a are computed according to the following equations, where $\theta_d$ represents a phase difference between both polarization components, $\phi$ indicates the direction of the vector showing the current distribution, $\tau$ shows an eddy state and a expresses a magnitude of the flow. The magnitude of the flow is a synthesized amplitude of both polarization components.

$$\theta_d = \theta_H' - \theta_V' \tag{7.6}$$

$$\phi = \frac{1}{2}\tan^{-1}\left(\frac{2G_H'G_V'\cos(\theta_d)}{(G_H')^2 - (G_V')^2}\right) \tag{7.7}$$

$$\tau = \frac{1}{2}\sin^{-1}\left(\frac{2G_H'G_V'\sin(\theta_d)}{(G_H')^2 + (G_V')^2}\right) \tag{7.8}$$

$$a = \sqrt{(G_H')^2 + (G_V')^2} \tag{7.9}$$

The maximum amplitude value Max and the minimum amplitude value Min are predetermined and inputted to the measurement unit, and a calculation section 268 is provided for displaying the amplitude based on the reference bounded by the maximum value Max and the minimum value Min. The calculation section 268 receives the values a, Max, Min as data and calculates a' according to the following equation.

$$a' = \frac{\log(a/\text{Min})}{\log(\text{Max}/\text{Min})} \tag{7.10}$$

That is, the obtained solution a' expresses the logarithmic magnitude of a flow within a dynamic range bounded by Max and Min.

A color information change-over switch 270 is provided for selecting a variable from among a group of variables including $f_n'$ (or $t_n'$) outputted from the observation frequency list table 266, $\theta_d$, $\phi$, $\tau$ and a outputted from the polarization state calculation section 267 and a' outputted from the calculation section 268. The variable selected by the color information change-over switch 270 is supplied to a color code table 271 as an address value. The color code table 271 outputs color signal c corresponding to the value of the variable, and owing to the existence of the color code table 271, a color can be displayed with a hue corresponding to the variable. The color signal c is sent through a gate circuit 272 for blanking and displayed on a line information display 273 which displays the observation result as the line information. The line information display 273 displays a color expressed with color signal c with reference to the point designated by two-dimensional coordinates (x', y') on the screen. As described later, since coordinates (x', y') change continually, the line information display 273 resultantly depicts a line expressed with color signal c. The line information display 273 has a numerical display window 274 attached thereto for displaying the value of the observation center frequency $f_n'$ (or $t_n'$) to be outputted from the observation frequency list table 266.

A comparator 275 is provided for comparing the minimum amplitude Min with the above amplitude a, and the output of the comparator 275 is inputted to the gate 272 for blanking control together with a period pulse transmitted from the period pulse generator 262. When amplitude a is smaller than the minimum value Min or the period pulse is in a high level, the gate 272 outputs a black color signal (in the drawing, "1") and in other cases outputs color signal c (in the drawing, "0") from the color code table 271.

Next, description will be made with reference to a circuit of the line information display 273 for designating instantaneous coordinates (x', y') to be displayed. Here, an adder 276 is employed for producing x' by adding deviation Δx to be computed using the amplitude $G_H'$ and phase $\theta_H'$ of the horizontal polarization component to x-coordinates to be expressed with output m' from the M-ary counter 263. Similarly, another adder 277 is employed for producing y' by adding deviation Δy to be computed using the amplitude $G_V'$ and phase $\theta_V'$ of the vertical polarization component to y-coordinates to be expressed with output k' from the K-ary counter 264. As shown below, the deviations Δx and Δy change periodically passing the period center 0, thereby causing the line information display 273 to depict an ellipse with the center of coordinates (x, y). In the ellipse of present embodiment, the size and the direction as well as the degree of flatness of the ellipse express the vector flow which represents the current distribution on the observation objective.

Calculation sections 278 and 279 and a phase shifter 280 as well as a multiplier 281 are used for determining the deviation Δx, calculation sections 282 and 283 and a phase shifter 284 as well as a multiplier 285 are used for determining the deviation Δy. Further, with reference to amplitude, a display amplitude mode change-over switch 286 comprising duplex switches is provided for determining whether the amplitude is to be computed on the base of the logarithm or the antilogarithm.

With reference to the horizontal polarization component, the calculation section 278 calculates the following equation by inputting $G_H'$, Max and Min, $$\frac{\log(G_H'/\text{Min})}{\log(\text{Max}/\text{Min})}$$

According to the result, a logarithmic amplitude can be obtained with reference to the horizontal polarization component in the dynamic range. The calculation section 279 calculates the following equation by inputting $G_H'$ and Max.

$$\frac{G_H'}{\text{Max}}$$

According to the result, there is obtained an antilogarithmic ratio between the amplitude of the horizontal polarization component and the maximum amplitude Max. A phase shifter 280 shifts the phase of a sine-wave signal transmitted from the display sine-wave signal generator 261 by amount $\theta_H'$. The output selected by the display amplitude mode change-over switch 286 from among the outputs of the calculation sections 278 and 279 and the output from the phase shifter 280 are inputted to the multiplier 281, and the output of the multiplier 281 gives the above deviation Δx.

In the same way, the calculation section 282 calculates the following equation with reference to the vertical polarization component, $$\frac{\log(G_V'/\text{Min})}{\log(\text{Max}/\text{Min})}$$

and the calculation section 283 calculates the following equation.

$$\frac{G_V'}{\text{Max}}$$

The phase shifter 284 shifts the phase of the sine-wave signal by amount $\theta_V'$. The output selected by the display amplitude mode change-over switch 286 from among the outputs of the calculation sections 282 and 283 and the output from the phase shifter 284 are inputted to the multiplier 285, and the output of the multiplier 285 gives the above deviation Δx.

As described above, the coordinates (x', y') to be instantaneously displayed on the line information display 273 is determined, and this coordinates point (x', y') is displayed with the color based on the variable selected by the color information change-over switch 270. When an image is displayed on the line information display 273, it is of course allowable to catch the image of the observation objective by such as a video camera and display the image of the line information display 273 with the overlapped camera-presented image. Further, a display method using a contour may be used in combination.

Figure 14:
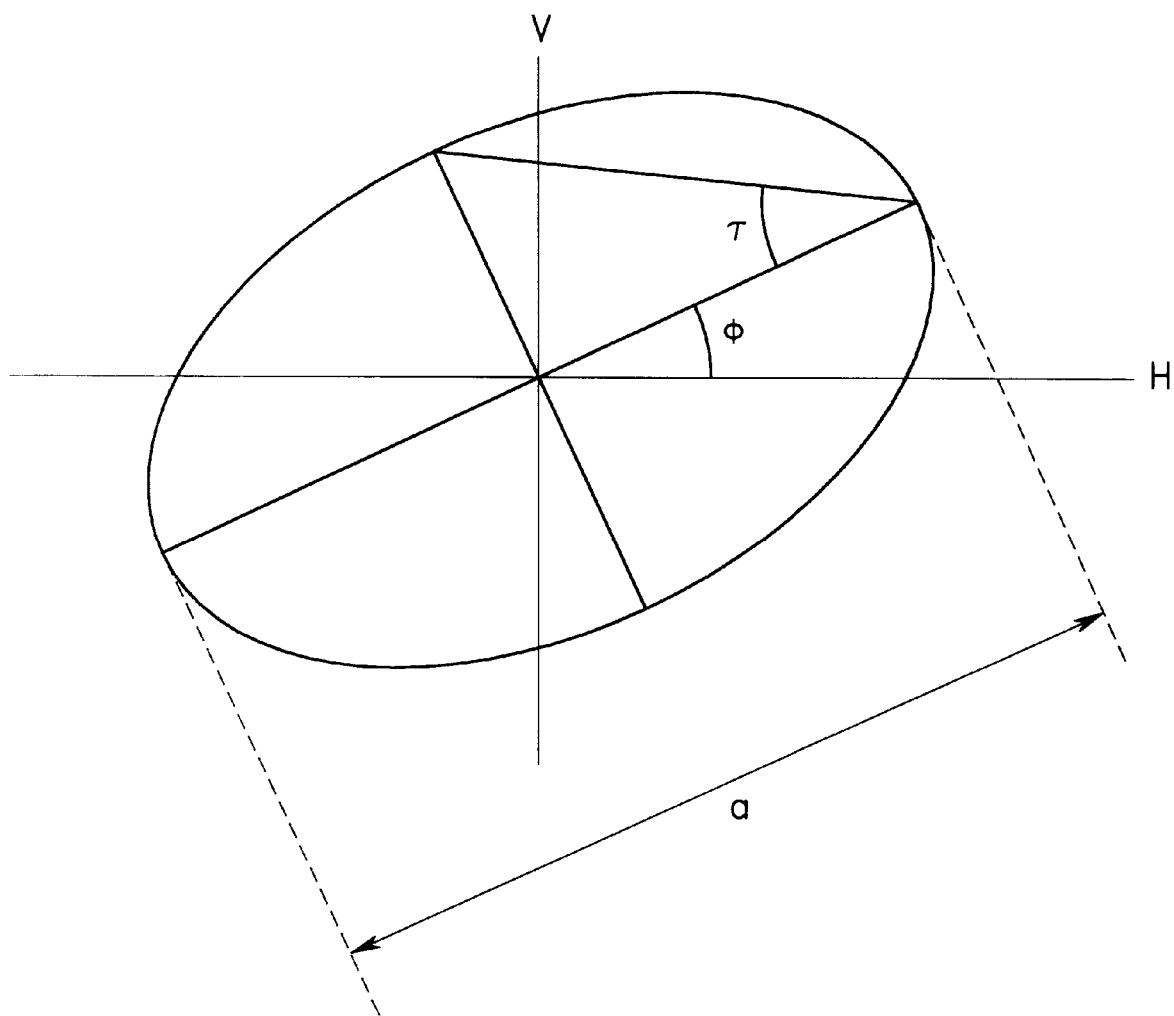
FIG. 14 is a diagram showing an ellipse graph used for displaying.

Next, it will be described in detail what kind of display can be made by using this kind of display coordinates (x', y'). The phase shifters 280 and 284 give phase shift $\theta_H'$ and $\theta_V'$ to the same sine-wave signal, respectively. The outputs of the phase shifters 280 and 284 are multiplied by the amplitudes $G_H'$ and $G_V'$ by the multipliers 281 and 285, respectively, independent of the logarithm base or the antilogarithm base of the phase. As a result, a locus of an ellipse is obtained as shown in FIG. 14. If it is assumed that a major diameter of the ellipse is a, an angle between the major diameter and an H-axis φ, an elliptical open angle (an angle formed by lines connecting one end of a minor diameter, one end of the major diameter and the center of the ellipse) τ, these a, φ and τ are expressed by above equations (7.9), (7.7) and (7.8), respectively. Specifically, the direction of the major axis of the ellipse represents the direction of the vector flow with reference to the current distribution, the length a of the major axis shows a magnitude of the flow, and the ellipse open angle τ expresses a state of the eddy. The more the open angle τ becomes small, the more the current or the polarization approaches a linear form.

Figure 15A:
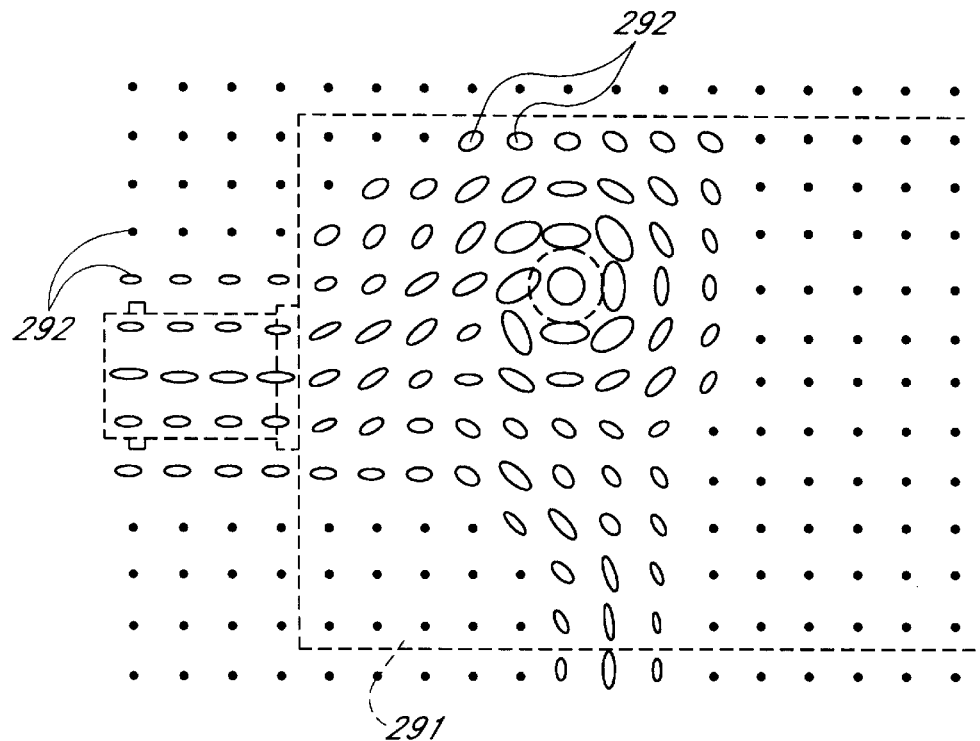
FIGS. 15A and 15B are diagrams showing examples of display.
Figure 15B:
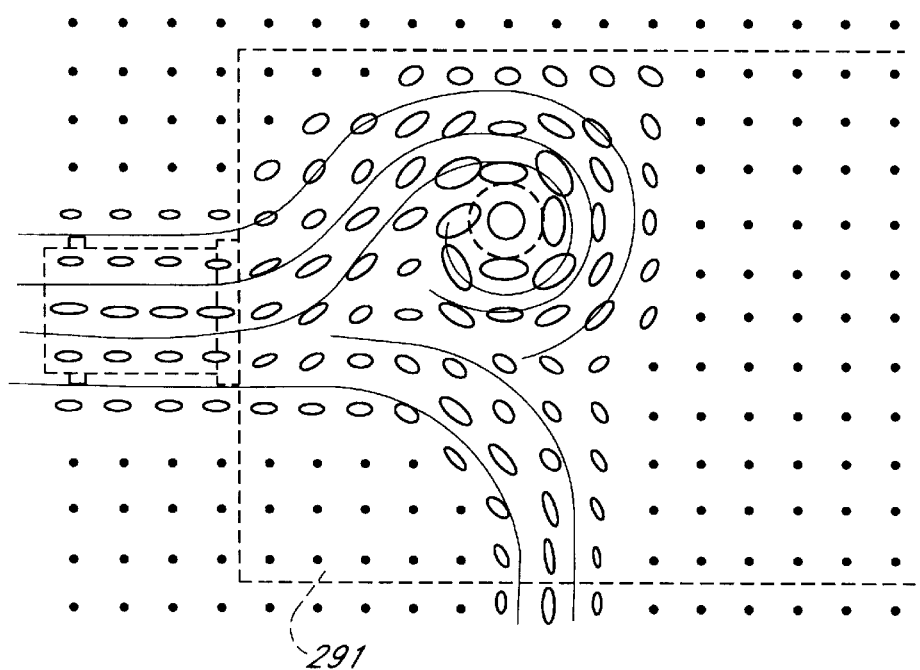

FIGS. 15A and 15B show examples typically. In FIG. 15A, observation results are superimposed on the image (illustrated in dashed lines) of an observation objective 291, and the observation result at each point is illustrated by an ellipse 292. FIG. 15B shows the vector flows estimated from the observation results of FIG. 15A with solid lines. Here, by applying the display method of this like, it becomes possible to easily confirm even the eddy current state which is caused by collision of the currents and unable to express by only using arrow marks. In other words, it becomes possible to easily recognize the vector flow to be generated according to such as the current distribution. Further, this display method can present more information in an understandable way compared with, not to speak of the conventional method which processes the amplitude and the phase to respective images for every polarization, but with the method which uses a bird's-eye view or contour lines.

With reference to the display of the time response, consideration is paid to the transform from the observation center frequency $f_n$ to time $t_n$, and calculation is performed in the data memory 237 as follows.

$$G_H'(x,y,t_n)e^{j\theta_H'(x,y,t_n)} = \int W(f_n)G_H(x,y,f_n)e^{j(2\pi f_n t_n + \theta_H'(x,y,f_n))}df_n \quad (7.11)$$

$$G_V'(x,y,t_n)e^{j\theta_V'(x,y,t_n)} = \int W(f_n)G_V(x,y,f_n)e^{j(2\pi f_n t_n + \theta_V'(x,y,f_n))}df_n \quad (7.12)$$

where, $W(f_n)$ is a weighting function, and for example, if $f_{max}$ is the maximum frequency, $W(f_n)$ is calculated by the next equation.

$$W(f_n) = \cos(\pi f_n / 2 f_{max}).$$

The wave distribution observation method of the present invention is not limited to the aspect described above. For example, in the measurement unit, the connection sequence of the ternary counter 231, N-ary counter 232, M-ary counter 234 and K-ary counter 235 is not limited to the above sequence, but it can be changed corresponding to the mechanism of such as the hologram observation plane 211. However, from the purpose of reducing the number of the scanning operations of the scanning antenna 212, it is preferable to finish the observation atone time for every coordinate point on the hologram observation plane 211 for each of a series of the observation center frequencies. Further, since switching of the change-over switch 217 can be performed more rapidly than switching of the observation center frequency $f_n$, if the operation stability of filtering sections 215 and 216 is considered, it is preferable to perform switching of the observed signals $S_R(f)$, $S_H(f)$ and $S_V(f)$ for every observation center frequency $f_n$ on every coordinate point.

In the measurement part of the above embodiment, the output from the filtering sections 215 are 216 are transformed to signals of different frequencies, respectively, and then after these two signals are multiplied, the multiplied result is detected by the SFI vector detector 226. However, as shown in JP, A, 08201459, it is possible to apply a structure in which the signals from the filtering sections 215 and 216 are transformed to the signal of the same frequency and then each signal is separately processed through Fourier integration.

With reference to image displaying on the display unit, the phase expressed by the following equation can be given as the color information.

$$\dot{E}_m = G_H' e^{j\theta_H'} \cdot \cos(\phi) + G_V' e^{j\theta_V'} \cdot \sin(\phi)$$

where $\dot{E}_m$ gives the major axis vector of the ellipse, and the phase of $\dot{E}_m$ gives the phase of the vector composed in the direction of the major axis.

As described above, according to the wave distribution observation method of the present invention, it is possible to cancel the phase-locked loop offset to be produced when the observation frequency is switched and to perform the observation of a two-dimensional complex interferogram at one scanning for different observation frequencies.

Although certain preferred embodiments of the present invention have been shown and described in detail, it should be understood that various changes and modifications may be made therein without departing from the scope of the appended claims.

What is claimed:

1. A hologram observation method for estimating a three-dimensional wave source distribution by a hologram observation, comprising the steps of:

(i) performing a hologram observation at different frequencies to reconstruct a hologram image at each frequency, said reconstructed hologram image comprising a wave source image;

(ii) selecting a wave source of interest as a measuring area from said wave source image;

(iii) obtaining three-dimensional coordinates of the selected wave source in said area;

(iv) synthesizing a hypothetically observed wave as if a virtual wave source having a unit exists at said three-dimensional coordinates and accordingly reconstructing a hologram image; and (v) obtaining an accurate wave source intensity from a ratio of a wave source intensity in the reconstructed hypothetical hologram image in step (iv) to a wave source intensity of the selected wave source in step (ii) thereby accurately estimating a three-dimensional wave source distribution.

2. The hologram observation method according to claim 1, wherein a region is excluded from the area selected in said second step, the region exhibiting an intensity more than a predetermined value in the image reconstructed in said fourth step, and said third, fourth and fifth steps are performed repeatedly.

3. The hologram observation method according to claim 1, wherein in said fourth step said observed wave is synthesized considering a directivity of a sensor used for the hologram observation and a spread in the image reconstructed.

4. The hologram observation method according to claim 2, wherein in said fourth step said observed wave is synthesized considering a directivity of a sensor used for the hologram observation and a spread in the image reconstructed.

5. A method for estimating a stereoscopic directivity of a measured antenna, comprising steps of:

an observation step for using said measured antenna as a primary wave source, disposing an observation point to receive a direct wave and a reflection wave from said primary wave source and obtaining three-dimensional coordinates of said primary wave source and an intensity thereof and three-dimensional coordinates of a mirror image wave source and an intensity thereof by a two-frequency hologram observation, said mirror image wave source corresponding to said reflection wave;

an orientation determination step for obtaining an orientation of a reflection point corresponding to said mirror image wave source when viewed from said primary wave source based on the three-dimensional coordinates of said primary wave source and said mirror image wave source which are obtained in said observation step and based on three-dimensional coordinates of said observation point; and a computing step for computing an antenna directivity of said primary wave source toward a direction of said reflection point, by multiplying a reciprocal number of a reflection coefficient at said reflection point with an intensity of a mirror image wave source corresponding to said reflection point.

6. A method for estimating a stereoscopic directivity of a measured antenna, comprising steps of:

a first step for using said measured antenna as a primary wave source, disposing an observation point to receive a direct wave and a reflection wave from said primary wave source;

a second step for performing a hologram observation at different frequencies not less than one to reconstruct an image of a hologram at each frequency;

a third step for selecting a wave source to be extracted as an area from a wave source image in the reconstructed image;

a fourth step for obtaining three-dimensional coordinates of the selected wave source in said area;

a fifth step for synthesizing an observation wave assuming that a virtual unit wave source exists in the three-dimensional coordinates obtained in said fourth step and for reconstructing a hologram image from a synthesizing result;

a sixth step for obtaining a true wave source intensity from a ratio of an intensity in the image reconstructed in said fifth step to an actual intensity of the wave source selected in said third step;

an orientation determination step for obtaining an orientation of a reflection point corresponding to a mirror image wave source when viewed from said primary wave source based on the three-dimensional coordinates of said primary wave source, said mirror image wave source and said observation point, said mirror image wave source being a wave source corresponding to said reflection wave; and a computing step for computing an antenna directivity of said primary wave source toward a direction of said reflection point, by multiplying a reciprocal number of a reflection coefficient at said reflection point with an intensity of a mirror image wave source corresponding to said reflection point.

7. The method according to claim 5, wherein in said orientation determination step an incidence angle at said reflection point when viewed from said primary wave source is also measured, and in said computing step after said reflection coefficient is computed based on said incidence angle, said antenna directivity is computed.

8. The method according to claim 6, wherein in said orientation determination step an incidence angle at said reflection point when viewed from said primary wave source is also measured, and in said computing step after said reflection coefficient is computed based on said incidence angle, said antenna directivity is computed.

9. The method according to claim 5, wherein at one observation point, a plurality of mirror image wave sources are observed and said orientation determination step and said computing steps are executed for each mirror wave source.

10. The method according to claim 6, wherein at one observation point, a plurality of mirror image wave sources are observed and said orientation determination step and said computing steps are executed for each mirror wave source.

11. The method according to claim 5, wherein said observation step, said orientation determination step and said computing step are repeatedly executed while said observation point is being moved.

12. The method according to claim 6, wherein said first step, said second step, said third step, said fourth step, said fifth step, said sixth step, observation step, said orientation determination step and said computing step are repeatedly executed while said observation point is being moved.

13. A method for observing a wave distribution by performing a two-dimensional interference measurement for radiating waves of a plurality of observation frequencies, comprising steps of:

providing a first sensor for detecting said radiating wave to output a first signal, a second sensor for detecting said radiating wave to output a second signal, and a first measurement system and a second measurement system each for extracting a component of a selected observation frequency from said plurality of observation frequencies, each of said first and second measurement systems having a phase-locked loop;

a first step for obtaining a correlation between outputs of said first and second measurement systems to output a first correlation value by inputting said first signal to said first and second measurement systems;

a second step for obtaining a correlation between outputs of said first and second measurement systems to output a second correlation value by inputting said first signal to said first measurement system while inputting said second signal to said second measurement system;

selecting different observation frequencies and performing said first step and said second step for each of the selected different observation frequencies to obtain said first and second correlation values; and canceling, by using said first correlation value, an affection of a phase offset value of said phase-locked loop due to a change in an observation frequency, said affection being included in said second correlation value.

14. A method for observing a wave distribution by performing a two-dimensional interference measurement for radiating waves of a plurality of observation frequencies, comprising steps of:

providing a first sensor for detecting said radiating wave to output a first signal, a second sensor for detecting a first polarization component and a second polarization component of said radiating wave to output a second signal and a third signal, respectively, and a first measurement system and a second measurement system each for extracting a component of a selected observation frequency from said plurality of observation frequencies, each of said first and second measurement systems having a phase-locked loop;

a first step for obtaining a correlation between outputs of said first and second measurement systems to output a first correlation value by inputting said first signal to said first and second measurement systems;

a second step for obtaining a correlation between outputs of said first and second measurement systems to output a second correlation value by inputting said first signal to said first measurement system while inputting said second signal to said second measurement system;

a third step for obtaining a correlation between outputs of said first and second measurement systems to output a third correlation value by inputting said first signal to said first measurement system while inputting said third signal to said second measurement systems; and a fourth step for selecting different observation frequencies, performing said first step, said second step and said third step for each of the selected different observation frequencies to obtain said first, second and third correlation values, canceling, by using said first correlation value, affections of a phase offset value of said phase-locked loop due to a change in an observation frequency, and acquiring an amplitude and a phase for said first polarization component and an amplitude and a phase for said second polarization component, said affections being included in said second and third correlation values.

15. The method according to claim 14, further comprising a step of acquiring, for each position of a reception point of at least one of said first sensor and said second sensor, an amplitude $G_1$ and a phase $\theta_1$ for said first polarization component and an amplitude $G_2$ and a phase $\theta_2$ for said second polarization component while changing the position of the reception point.

16. The method according to claim 15, further comprising steps of:

generating an ellipse based on the amplitudes $G_1$ and $G_2$ and the phases $\theta_1$ and $\theta_2$ for each position; and displaying said ellipse on a display screen at point corresponding to the position of the reception point to visualizing the wave distribution.

17. The method according to claim 15, further comprising steps of:

reconstructing a hologram image based on the amplitudes $G_1$ and $G_2$ and the phases $\theta_1$ and $\theta_2$ at each position of the reception point;

acquiring, for each point in the reconstructed hologram image, an amplitude $G_1'$ and a phase $\theta_1'$ for said first polarization component and an amplitude $G_2'$ and a phase $\theta_2'$ for said second polarization component;

generating an ellipse based on the amplitudes $G_1'$ and $G_2'$ and the phases $\theta_1'$ and $\theta_2'$ at each point; and displaying said ellipse on a display screen at a display point corresponding to the point to visualizing the wave distribution.

18. The method according to claim 17, further comprising steps of:

calculating polarization state based on the amplitudes $G_1'$ and $G_2'$ and the phases $\theta_1'$ and $\theta_2'$ at each point; and changing a displayed color of said ellipse according to the calculated polarization state.

19. A wave distribution displaying method based on an amplitude $G_1''$ and a phase $\theta_1''$ for a first polarization component and an amplitude $G_2''$ and a phase $\theta_2''$ for a second polarization component at a point, the polarization components being orthogonal to each other and representative of the displayed wave, comprising steps of:

generating an ellipse based on the amplitudes $G_1''$ and $G_2''$ and the phases $\theta_1''$ and $\theta_2''$ at the point; and displaying said ellipse on a display screen at a display point corresponding to the point.

20. The wave distribution displaying method according to claim 19, further comprising steps of:

calculating polarization state based on the amplitudes $G_1''$ and $G_2''$ and the phases $\theta_1''$ and $\theta_2''$ at each point; and changing a displayed color of said ellipse according to the calculated polarization state.

21. The wave distribution displaying method according to claim 19, further comprising steps of:

determining a major diameter of said ellipse according to a synthesized amplitude of said amplitudes $G_1''$ and $G_2''$;

determining an orientation of said major diameter of said ellipse according to a direction of a vector flow by said first and second polarization components; and determining an open angle of said ellipse according to a shape of eddy by said first and second polarization components.

* * * * *